United States Patent
Deak et al.

(10) Patent No.: US 10,663,536 B2
(45) Date of Patent: May 26, 2020

(54) MAGNETORESISTIVE SENSOR WAFER LAYOUT USED FOR A LASER WRITING SYSTEM, AND CORRESPONDING LASER SCANNING METHOD

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 16/333,121

(22) PCT Filed: Sep. 13, 2017

(86) PCT No.: PCT/CN2017/101663
§ 371 (c)(1),
(2) Date: Mar. 13, 2019

(87) PCT Pub. No.: WO2018/050082
PCT Pub. Date: Mar. 22, 2018

(65) Prior Publication Data
US 2019/0227129 A1    Jul. 25, 2019

(30) Foreign Application Priority Data

Sep. 13, 2016 (CN) .......................... 2016 1 0821610

(51) Int. Cl.
*G01R 33/09* (2006.01)
*G01R 33/00* (2006.01)
*G06F 30/392* (2020.01)

(52) U.S. Cl.
CPC ....... *G01R 33/093* (2013.01); *G01R 33/0005* (2013.01); *G01R 33/0052* (2013.01); *G01R 33/098* (2013.01); *G06F 30/392* (2020.01)

(58) Field of Classification Search
CPC ...... G01R 33/093; G01R 33/06; G01R 33/09; G01R 33/0076; G01R 33/0005;
(Continued)

(56) References Cited

U.S. PATENT DOCUMENTS

| 9,389,099 B2 * | 7/2016 | Deak ..................... G01D 5/2497 |
| 2014/0021571 A1 * | 1/2014 | Lei .......................... G01B 7/30 |
| | | 257/427 |

(Continued)

FOREIGN PATENT DOCUMENTS

| CN | 102208530 A | 10/2011 |
| CN | 203587786 | 5/2014 |
| CN | 104900802 | 9/2015 |
| CN | 204739999 | 11/2015 |
| CN | 105716632 A | 6/2016 |
| CN | 106324534 A | 1/2017 |

(Continued)

OTHER PUBLICATIONS

"International Application No. PCT/CN2017/101663, International Search Report and Written Opinion dated Nov. 1, 2017", (Nov. 1, 2017), 10 pgs.

*Primary Examiner* — Eduardo A Rodela
(74) *Attorney, Agent, or Firm* — Schwegman Lundberg & Woessner, P.A.

(57) ABSTRACT

A magnetoresistive sensor wafer layout scheme used for a laser writing system and laser scanning method are disclosed. The layout scheme comprises a magnetoresistive multilayer film including an antiferromagnetic pinning layer arranged into a rectangular array of sensor dice on the wafer surface. Pinning layers of magnetoresistive sensing units are magnetically oriented and directionally aligned by the laser writing system. Sensing units are electrically connected into bridge arms electrically connected into a magnetoresistive sensor. Magnetoresistive sensing units in the dice are arranged into at least two spatially-isolated magnetoresistive orientation groups. In the magnetoresistive orientation groups, pinning layers of the sensing units have an angle of magnetic orientation of 0-360 degrees. Angles of magnetic (Continued)

orientation of two adjacent magnetoresistive orientation groups are different. Each orientation group is adjacent to an orientation group with the same angle of magnetic orientation in at least one adjacent die.

19 Claims, 21 Drawing Sheets

(58) Field of Classification Search
CPC .............. G01R 33/098; G01R 33/0052; G01R 31/2829; G01R 7/30; G01R 5/145; G06F 30/392; H01L 43/00; H01L 43/02; H01L 43/04; H01L 43/06; H01L 43/08; H01L 43/12

See application file for complete search history.

(56) References Cited

U.S. PATENT DOCUMENTS

| | | | |
|---|---|---|---|
| 2014/0247042 A1* | 9/2014 | Lei | G01R 33/093 324/247 |
| 2014/0327437 A1* | 11/2014 | Han | G01R 19/32 324/252 |
| 2015/0091560 A1* | 4/2015 | Deak | G01R 33/093 324/252 |
| 2016/0178397 A1 | 6/2016 | Jost et al. | |

FOREIGN PATENT DOCUMENTS

| | | |
|---|---|---|
| CN | 206235722 U | 6/2017 |
| WO | WO-2018050082 A1 | 3/2018 |

* cited by examiner

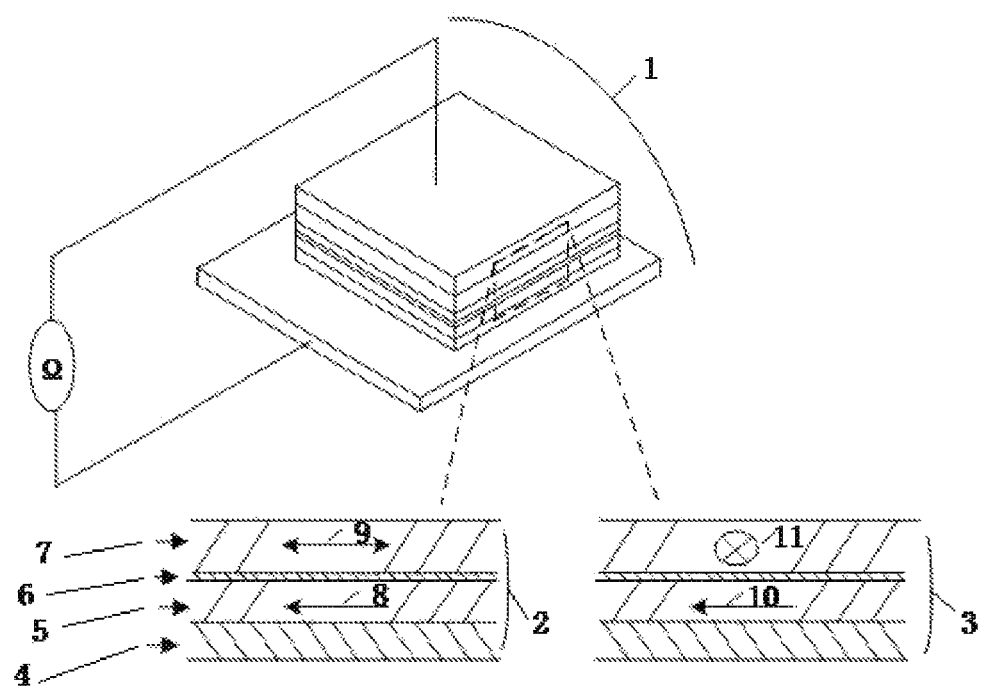
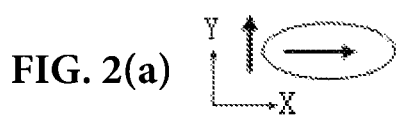 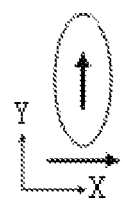
FIG. 1
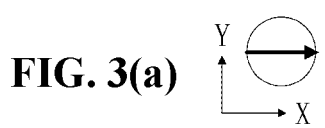 

MAGNETORESISTIVE SENSOR WAFER LAYOUT USED FOR A LASER WRITING SYSTEM, AND CORRESPONDING LASER SCANNING METHOD

PRIORITY CLAIM TO RELATED APPLICATIONS

This application is a U.S. national stage filing under 35 U.S.C. § 371 from International Application No. PCT/CN2017/101663, filed on 13 Sep. 2017, and published as WO2018/050082 on 22 Mar. 2018, which claims the benefit under 35 U.S.C. 119 to Chinese Application No. 201610821610.7, filed on 13 Sep. 2016, the benefit of priority of each of which is claimed herein, and which applications and publication are hereby incorporated herein by reference in their entirety.

TECHNICAL FIELD

The present invention relates to the field of magnetic sensors, in particular to a magnetoresistive sensor wafer layout used for a laser writing system, and a laser scanning method.

BACKGROUND ART

Push-pull magnetoresistive sensors are widely used in design because of the high sensitivity signal and temperature compensation performance Often, a flip die method is used to obtain push magnetoresistive sensing units and pull magnetoresistive sensing units. For a single-axis magnetoresistive sensor such as an X-axis magnetoresistive sensor, at least two die are needed, and the rotation angle of the dice needs to be flipped for 0 and 180 degrees respectively. For a two-axis magnetoresistive sensor such as two-axis X-Y magnetoresistive sensor, at least four dice are needed, and the rotation angles of the dice need to be 0, 90, 180 and 270 degrees respectively. The disadvantages are that many dice are needed, the angular alignment of the dice is performed by mechanical operations, and therefore there is an angle error that degrades sensor performance. Moreover, the dice of the sensor need to be connected through leads, increasing the complexity of the process.

Another solution is to use soft ferromagnetic flux concentrators to construct a specific magnetic path on a magnetoresistive sensing unit string in order to steer the direction of the X-direction external magnetic field into the X-direction and the −X-directions after passing through soft ferromagnetic flux concentrators. That is, the preparation of the push-pull magnetoresistive sensor is realized by altering the magnetic field direction in the vicinity of the multilayer film structure, while leaving the sensingdirection of the magnetoresistive sensor film unchanged. The disadvantages of this method are that the introduction of the soft ferromagnetic flux concentrator increases the complexity of the process, and moreover, the linearity of the magnetoresistive sensor may be affected due to the hysteresis caused by the magnetic domain movement within the soft ferromagnetic flux concentrators.

Additionally, from the point of view of statistical averaging, for X and −X magnetoresistive sensing units, the magnetoresistive sensing units having the have orientation angles of 0 degrees and 180 degrees, but manufacturing tolerances produce a distribution of angles about the 0 and 180 degree directions. For Y and −Y magnetoresistive sensing units, the magnetoresistive sensing units have orientation angles of 90 degrees and 270 degrees, with many magnetoresistive sensing units have a distribution within a certain range taking 90 degrees and 270 degrees as centers. The orientation angle range usually varies in the range of −90 to +90 degrees. Therefore, for the double-axis X-Y linear or angular sensors, it is not easy to accurately measure the magnetic field in the range of 0 to 360 degrees without some error caused by inaccurate die placement.

In the laser scanning method, the multilayer film structures of the magnetoresistive sensing units, the magnetoresistive sensing units such as TMR or GMR spin-valve magnetoresistive sensing units are heated to a temperature above the blocking temperature of the antiferromagnetic layer by scanning a laser, and applying an external magnetic field in the direction of X or −X, Y or −Y as well as the direction at a (−90,+90) extended angle is applied along a particular direction in the cooling process, and thus push-pull single-axis or double-axis magnetoresistive sensors can also be produced, so that the magnetization direction of the antiferromagnetic layer can be changed by laser thermal annealing without changing the multilayer film structure of the sensor, and the problems of die alignment and addition of the soft ferromagnetic flux concentrator are avoided. However, there are a great number of magnetoresistive sensing units on a wafer during production. How to select a suitable layout design of magnetoresistive sensing units with various magnetic moment orientations of single-axis or double-axis magnetoresistive sensors and select a suitable laser scanning path to improve the efficiency of laser writing process is a problem to be solved by the present invention.

SUMMARY OF THE INVENTION

In order to solve the above-mentioned problems, the present invention discloses a magnetoresistive sensor wafer layout used for a laser writing system. The wafer layout comprises a plurality of rectangular dice forming an array, the surface of each of the dice is provided with a magnetoresistive multilayer film, the magnetoresistive multilayer film comprises antiferromagnetic layers, the magnetoresistive multilayer film is patterned into magnetoresistive sensing units, the antiferromagnetic layers of the magnetoresistive sensing units are magnetically oriented and directionally aligned through the laser writing system, the magnetoresistive sensing units are electrically connected to form bridge arms, the bridge arms are electrically connected to form a magnetoresistive sensor, and it is characterized in that the magnetoresistive sensing units are arranged to form at least two spatially-isolated magnetoresistive orientation groups, in each magnetoresistive orientation group, the magnetization orientation angle of the antiferromagnetic layers of the magnetoresistive sensing units is the same, the range of the magnetization orientation angle is 0 to 360 degrees, the magnetization orientation angles of two adjacent magnetoresistive orientation groups are different, and each magnetoresistive orientation group is adjacent to the magnetoresistive orientation group having the same magnetization orientation angle in at least one adjacent die.

Further, the magnetoresistive sensing unit is a TMR sensing unit or GMR spin-valve sensing unit, the magnetoresistive sensing unit comprises a ferromagnetic free layer/a nonmagnetic isolation layer/a single layer stack-structured ferromagnetic reference layer, or the magnetoresistive sensing unit comprises a ferromagnetic free layer/a nonmagnetic isolation layer/a multilayer film-structured ferromagnetic reference layer, the single layer stack-structured ferromagnetic reference layer is an antiferromagnetic layer/ ferromagnetic reference layer, and the multilayer film-structured ferromagnetic reference layer is an antiferromagnetic layer/n intermediate layers/ferromagnetic reference layer, wherein the intermediate layer is a ferromagnetic layer/metal spacing layer, and n is an integer greater than or equal to 1.

Further, the magnetoresistive sensor is a linear magnetoresistive sensor or an angular magnetoresistive sensor, and when no external magnetic field is applied, the magnetization direction of the ferromagnetic free layer of the magnetoresistive sensing unit corresponding to the linear magnetoresistive sensor is set by one or more means of permanent magnet biasing, double exchange effect and shape anisotropy.

Further, the magnetoresistive sensor is a single-axis X push-pull magnetoresistive sensor or a double-axis X-Y push-pull magnetoresistive sensor, the single-axis X push-pull magnetoresistive sensor and the double-axis X-Y push-pull magnetoresistive sensor are of a full-bridge, half-bridge or quasi-bridge structure, respectively, the single-axis X push-pull magnetoresistive sensor comprises a single-axis X linear magnetoresistive sensor and a single-axis X angular magnetoresistive sensor, the double-axis X-Y push-pull magnetoresistive sensor comprises a double-axis X-Y linear magnetoresistive sensor and a double-axis X-Y angular magnetoresistive sensor, the single-axis X linear magnetoresistive sensor and the single-axis X angular magnetoresistive sensor each comprise an X push arm and an X pull arm, the double-axis X-Y linear magnetoresistive sensor and the double-axis X-Y angular magnetoresistive sensor each comprise an X push arm, an X pull arm, a Y push arm and a Y pull arm, the X push arm comprises a push X-axis magnetoresistive sensing unit, the X pull arm comprises a pull X-axis magnetoresistive sensing unit, the Y push arm comprises a push Y-axis magnetoresistive sensing unit, and the Y pull arm comprises a pull Y-axis magnetoresistive sensing unit.

Further, the push X-axis magnetoresistive sensing unit comprises an X push magnetically-oriented magnetoresistive sensing unit having a magnetization orientation angle of 0 degrees, or totally 2n types of X push magnetically-oriented magnetoresistive sensing units having magnetization orientation angles of $(+\theta 11, -\theta 11), (+\theta 12, -\theta 12), \ldots, (+\theta 1n, -\theta 1n)$ degrees, or totally 2n+1 types of X push magnetically-oriented magnetoresistive sensing units having magnetization orientation angles of $0, (+\theta 11, -\theta 11), (+\theta 12, -\theta 12), \ldots, (+\theta 1n, -\theta 1n)$ degrees;

the pull X-axis magnetoresistive sensing unit comprises an X pull magnetically-oriented magnetoresistive sensing unit having a magnetization orientation angle of 180 degrees, or totally 2n types of X pull magnetically-oriented magnetoresistive sensing units having magnetization orientation angles of $(180+\theta 11, 180-\theta 11), (180+\theta 12, 180-\theta 12), \ldots, (180+\theta 1n, 180-\theta 1n)$ degrees, or totally 2n+1 types of X pull magnetically-oriented magnetoresistive sensing units having magnetization orientation angles of $180, (180+\theta 11, 180-\theta 11), (180+\theta 12, 180-\theta 12), \ldots, (180+\theta 1n, 180-\theta 1n)$ degrees;

the push Y-axis magnetoresistive sensing unit comprises a Y push magnetically-oriented magnetoresistive sensing unit having a magnetization orientation angle of 90 degrees, or totally 2n types of Y push magnetically-oriented magnetoresistive sensing units having magnetization orientation angles of $(90+\theta 21, 90-\theta 21), (90+\theta 22, 90-\theta 22), \ldots, (90+\theta 2n, 90-\theta 2n)$ degrees, or totally 2n+1 types of Y push magnetically-oriented magnetoresistive sensing units having magnetization orientation angles of $90, (90+\theta 21, 90-\theta 21), (90+\theta 22, 90-\theta 22), \ldots, (90+\theta 2n, 90-\theta 2n)$ degrees; and the pull Y-axis magnetoresistive sensing unit comprises a Y pull magnetically-oriented magnetoresistive sensing unit having a magnetization orientation angle of 270 degrees, or totally 2n types of Y pull magnetically-oriented magnetoresistive sensing units having magnetization orientation angles of $(270+\theta 21, 270-\theta 21), (270+\theta 22, 270-\theta 22), \ldots, (270+\theta 2n, 270-\theta 2n)$ degrees, or totally 2n+1 types of Y pull magnetically-oriented magnetoresistive sensing units having magnetization orientation angles of $270, (270+\theta 21, 270-\theta 21), (270+\theta 22, 270-\theta 22), \ldots, (270+\theta 2n, 270-\theta 2n)$ degrees, wherein the values of $\theta 11, \theta 12, \ldots, \theta 1n, \theta 21, \theta 22, \ldots, \theta 2n$ are respectively between 0 and 90 degrees, and n is a positive integer greater than or equal to 1.

Further, any magnetoresistive orientation group comprises magnetically-oriented magnetoresistive sensing unit strings arranged in parallel, each magnetically-oriented magnetoresistive sensing unit string comprises a plurality of magnetoresistive sensing units, and the magnetically-oriented magnetoresistive sensing unit strings are in parallel with each other.

Further, the arrangement of the half-bridge structure of the single-axis X push-pull magnetoresistive sensor is as follows: the X push magnetically-oriented magnetoresistive sensing unit strings corresponding to the X push arm and the X pull magnetically-oriented magnetoresistive sensing unit strings corresponding to the X pull arm separately arranged as X push arm/X pull arm in two rows and one column or two columns and one row, and the magnetically-oriented magnetoresistive sensing unit strings are in parallel with the direction of the row or the column.

Further, the arrangement of the full-bridge structure of the single-axis X push-pull magnetoresistive sensor is as follows: the X push magnetically-oriented magnetoresistive sensing unit strings corresponding to the X push arm and the X pull magnetically-oriented magnetoresistive sensing unit strings corresponding to the X pull arm separately arranged as X push arm/X push arm/X pull arm/X pull arm, X push arm/X pull arm/X push arm/X pull arm, X pull arm/X push arm/X push arm/X pull arm, or X push arm/X pull arm/X pull arm/X push arm in four rows and one column or four columns and one row, and the magnetically-oriented magnetoresistive sensing unit strings are in parallel with the direction of the row or the column.

Further, the arrangement of the half-bridge structure of the double-axis X-Y push-pull magnetoresistive sensor is as follows: the X push magnetically-oriented magnetoresistive sensing unit strings corresponding to the X push arm, the X pull magnetically-oriented magnetoresistive sensing unit strings corresponding to the X pull arm, the Y push magnetically-oriented magnetoresistive sensing unit strings corresponding to the Y push arm and the Y pull magnetically-oriented magnetoresistive sensing unit strings corresponding to the Y pull arm separately arranged as X push arm/Y push arm/Y pull arm/X pull arm, X push arm/Y pull arm/Y push arm/X pull arm, Y push arm/X push arm/X pull arm/Y pull arm, or Y push arm/X pull arm/X push arm/Y pull arm in four rows and one column or four columns and one row, and the magnetically-oriented magnetoresistive sensing unit strings are in parallel with the direction of the row or the column.

Further, the arrangement of the full-bridge structure of the double-axis X-Y push-pull magnetoresistive sensor is as follows: the X push magnetically-oriented magnetoresistive sensing unit strings corresponding to the X push arm, the X pull magnetically-oriented magnetoresistive sensing unit strings corresponding to the X pull arm, the Y push magnetically-oriented magnetoresistive sensing unit strings corresponding to the Y push arm and the Y pull magnetically-oriented magnetoresistive sensing unit strings corresponding to the Y pull arm separately arranged as X half bridge/Y full bridge/X half bridge, Y half bridge/X full bridge/Y half bridge, X double push arms/Y full bridge/X double pull arm bridge, or Y double push arms/X full bridge/Y double pull arms in eight rows and one column or eight columns and one row, wherein the X half bridge is X push arm/X pull arm, the Y half bridge is Y push arm/Y pull arm, the X full bridge is X push arm/X push arm/X pull arm/X pull arm, X push arm/X pull arm/X push arm/X pull arm, X pull arm/X push arm/X push arm/X pull arm, or X push arm/X pull arm/X pull arm/X push arm, the Y full bridge is Y push arm/Y push arm/Y pull arm/Y pull arm, Y push arm/Y pull arm/Y push arm/Y pull arm, Y pull arm/Y push arm/Y push arm/Y pull arm, or Y push arm/Y pull arm/Y pull arm/Y push arm, the X double push arms are X push arm/X push arm, the X double pull arms are X pull arm/X pull arm, the Y double push arms are Y push arm/Y push arm, and the magnetically-oriented magnetoresistive sensing unit strings are in parallel with the direction of the row or the column.

Further, in the arrangement structure of the X push arm/X push arm, the X pull arm/X pull arm, the Y push arm/Y push arm and the Y pull arm/Y pull arm, the magnetoresistive orientation groups formed by the X push magnetically-oriented magnetoresistive sensing unit strings corresponding to two X push arms and having the same magnetic orientation angle are combined into a new magnetoresistive orientation group; the magnetoresistive orientation groups formed by the X pull magnetically-oriented magnetoresistive sensing unit strings corresponding to two X pull arms and having the same magnetic orientation angle are combined into a new magnetoresistive orientation group; the magnetoresistive orientation groups formed by the Y push magnetically-oriented magnetoresistive sensing unit strings corresponding to two Y push arms and having the same magnetic orientation angle are combined into a new magnetoresistive orientation group; and the magnetoresistive orientation groups formed by the Y pull magnetically-oriented magnetoresistive sensing unit strings corresponding to two Y pull arms and having the same magnetic orientation angle are combined into a new magnetoresistive orientation group.

Further, the arrangement of the full-bridge structure of the single-axis X push-pull magnetoresistive sensor is as follows: the two X push arms and the two X pull arms are arranged as an array of two rows and two columns, wherein the two X push arms and the two X pull arms are respectively located in the same row or the same column, and the X pull magnetoresistive orientation groups having the same magnetic orientation angle and corresponding to the two X push arms or the X pull magnetoresistive orientation groups having the same magnetic orientation angle and corresponding to the two X pull arms form a new magnetoresistive orientation group along the direction of the same row or the same column.

Further,
the arrangement of the full bridge structure of the double-axis X-Y push-pull magnetoresistive sensor is as follows:
the two X push arms, two X pull arms, two Y push arms and two Y pull arms are arranged in an array of four rows and two columns, the second row and the third row respectively correspond to the X push arms and the X pull arms, and the first row and the fourth row respectively correspond to the Y push arms and the Y pull arms;
or the second row and the third row respectively correspond to the Y push arms and the Y pull arms, and the first row and the fourth row respectively correspond to the X push arms and the X pull arms,
wherein the X push magnetoresistive orientation groups having the same magnetic orientation angle and corresponding to the two X push arms in the same row or the same column form a new magnetoresistive orientation group along the direction of the same row or the same column, or the X pull magnetoresistive orientation groups having the same magnetic orientation angle and corresponding to the two X pull arms form a new magnetoresistive orientation group along the direction of the same row or the same column.

Further, the X push arm and X pull arm of the single-axis X push-pull magnetoresistive sensor respectively comprise at least two non-adjacent X push orientation subunits and X pull orientation subunits; and each orientation subunit comprises one or more magnetoresistive orientation groups, all the orientation subunits are arranged in a mixed manner, and two adjacent orientation subunits are different.

Further, the X push arm, X pull arm, Y push arm and Y pull arm of the double-axis X-Y push-pull magnetoresistive sensor respectively comprise at least two non-adjacent X push orientation subunits, X pull orientation subunits, Y push orientation subunits and Y pull orientation subunits, each orientation subunit comprises one or more magnetoresistive orientation groups, all the orientation subunits are arranged in a mixed manner, and two adjacent orientation subunits are different.

The present invention further provides a laser scanning method for the magnetoresistive sensor wafer layout. The method comprises the following steps:

S1: a laser spot scanning one or more magnetoresistive orientation groups or orientation subunits according to a scanning sequence;

S2: heating the antiferromagnetic layers of the magnetoresistive sensing units to above the blocking temperature through the laser spot in the scanning process;

S3: cooling the antiferromagnetic layers, and applying an external magnetic field along the direction of the magnetization orientation angle of the antiferromagnetic layers in the process of cooling to room temperature;

S4: removing the external magnetic field to realize the writing operation to the magnetoresistive sensing units with the magnetization orientation angle.

Further, the scanning sequence in which the laser spot scans multiple magnetoresistive orientation groups or orientation subunits in step S1 is as follows:

S11: the laser spot sequentially scanning the magnetoresistive orientation groups or orientation subunits having the same magnetization orientation angle in each of the adjacent dice along the direction of the magnetoresistive sensing unit string;

S12: changing to another row, and scanning a next magnetoresistive orientation group or orientation subunit having the same magnetization orientation angle until the scanning of the magnetoresistive orientation groups or orientation subunits having the same magnetization orientation angle is completed;

S13: after completing step S12, scanning a next magnetoresistive orientation group or orientation subunit having a different magnetization orientation angle.

Further, the scanning sequence in which the laser spot scans multiple magnetoresistive orientation groups or orientation subunits in step S1 is as follows:

S11: the laser spot sequentially scanning the adjacent magnetoresistive orientation groups or orientation subunits having the same magnetization orientation angle in each of the dice along the direction of the magnetoresistive sensing unit string;

S12: changing to another row, and scanning a next adjacent magnetoresistive orientation group or orientation subunit having the same magnetization orientation angle until the scanning of all magnetoresistive orientation groups or orientation subunits having the same magnetization orientation angle is completed;

S13: after completing step S12, scanning a next magnetoresistive orientation group or orientation subunit having a different magnetization orientation angle.

Further, the scanning sequence in which the laser spot scans one magnetoresistive orientation group or orientation subunit in the step is as follows:

S11: the laser spot sequentially scanning the magnetically-oriented magnetoresistive sensing unit strings in a single magnetoresistive orientation group or orientation subunit along the direction of the magnetoresistive sensing unit string;

S12: changing to another row, and scanning the magnetically-oriented magnetoresistive sensing unit strings in a next single magnetoresistive orientation group or orientation subunit along an opposite direction until the scanning of all magnetically-oriented magnetoresistive sensing unit strings in the single magnetoresistive orientation group or orientation subunit is completed.

The magnetoresistive sensor wafer layout used for the laser writing system provided by the present invention can reduce the time required for a laser scanning process while producing single-chip push-pull bridge magnetic sensors.

BRIEF DESCRIPTION OF THE DRAWINGS

FIG. 1 is a schematic view of a multilayer film structure of a TMR or GMR spin-valve sensing unit.

FIG. 2(a) and FIG. 2(b) are schematic diagrams of magnetoresistive sensing units of a linear magnetoresistive sensor.

FIG. 3(a) and FIG. 3(b) are schematic diagrams of magnetoresistive sensing units of an angular magnetoresistive sensor.

FIG. 14(a) and FIG. 14(b) are schematic diagrams of bridge structures of push-pull magnetoresistive sensing units.

DETAILED DESCRIPTION

Figure 4:
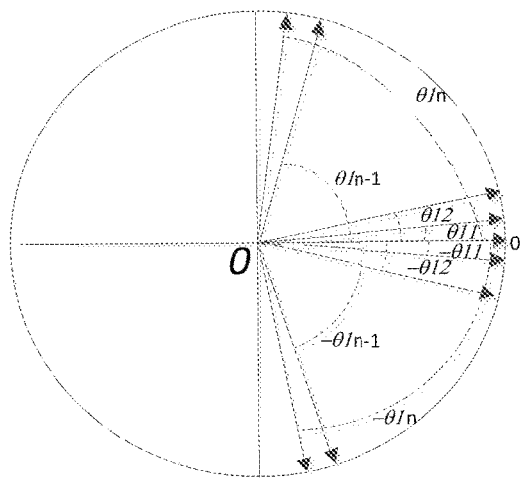
FIG. 4 is an orientation distribution diagram of pinning layers of +X-direction magnetoresistive sensing units.

In order to make the purposes, technical solutions and advantages of the embodiments of the present invention clearer, the technical solutions in the embodiments of the present invention will be described below clearly and completely with reference to the drawings in the embodiments of the present invention. Obviously, the described embodiments are part of the embodiments of the present invention, instead of all of the embodiments.

Embodiment 1

FIG. 1 is a schematic view of a multilayer film structure of a magnetoresistive sensing unit which is a GMR spin-valve or TMR sensing unit. The multilayer film structure 1 sequentially comprises an antiferromagnetic layer 4, a ferromagnetic reference layer 5, a nonmagnetic isolation layer 6 and a ferromagnetic free layer 7 from top to bottom, wherein 2 is the multilayer film structure corresponding to an angular magnetoresistive sensor, the magnetization direction 8 of the ferromagnetic reference layer 5 is the magnetic field sensitive direction of the angular magnetoresistive sensor, and the magnetization direction 9 of the ferromagnetic free layer 7 can rotate freely along the direction of an external magnetic field; 3 is the multilayer film structure corresponding to a linear magnetoresistive sensing unit, when no external magnetic field is applied, the magnetization direction 10 of the ferromagnetic reference layer 5 and the magnetization direction 11 of the ferromagnetic free layer 7 are perpendicular to each other, and at this time, the magnetization direction of the ferromagnetic free layer is set by one or more means of permanent magnet biasing, double exchange effect and shape anisotropy. In the present application, the magnetization direction of the ferromagnetic free layer is set to be perpendicular to the magnetization direction of the ferromagnetic reference layer.

FIG. 2 and FIG. 3 are respectively shapes corresponding to the linear magnetoresistive sensing unit and the angular magnetoresistive sensing unit, wherein the linear magnetoresistive sensing unit is in a shape of ellipse, the magnetization direction of the ferromagnetic reference layer is along the short axis direction of the ellipse, the magnetization direction of the free layer is along the long axis direction, FIG. 2(a) and FIG. 2(b) are respectively X-axis magnetoresistive sensing unit and Y-axis magnetoresistive sensing unit; and the angular magnetoresistive sensing unit is usually in a shape of circle, the magnetization direction of the reference layer is magnetic field sensitive direction, FIG. 3(a) and FIG. 3(b) are respectively X-axis angular magnetoresistive sensing unit and Y-axis angular magnetoresistive sensing unit.

Figure 5:
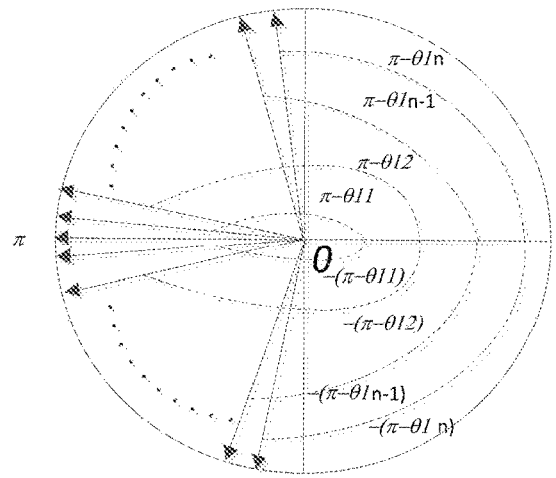
FIG. 5 is an orientation distribution diagram of pinning layers of −X-direction magnetoresistive sensing units.
Figure 6:
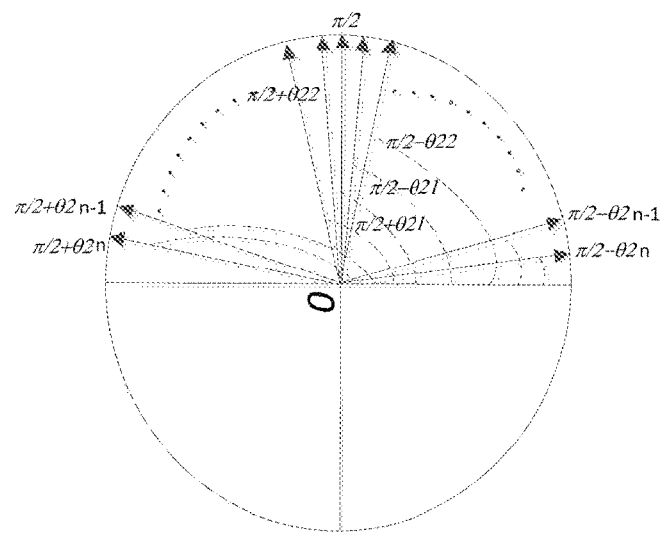
FIG. 6 is an orientation distribution diagram of pinning layers of +Y-direction magnetoresistive sensing units.
Figure 7:
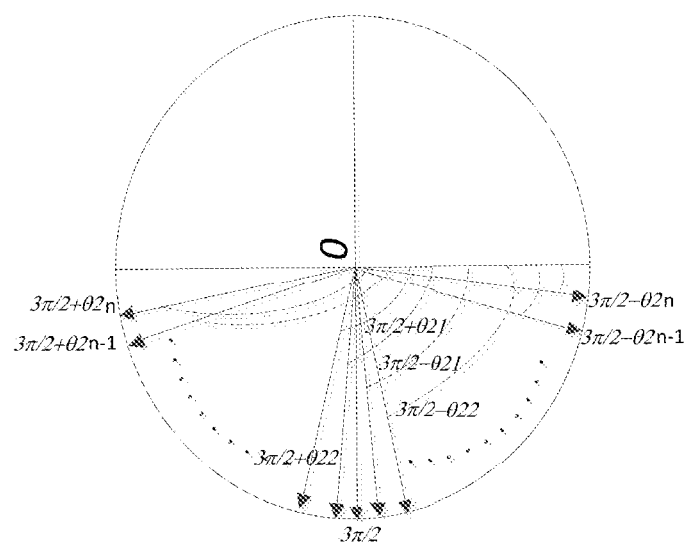
FIG. 7 is an orientation distribution diagram of pinning layers of −Y-direction magnetoresistive sensing units.

FIG. 4 and FIG. 5 are distribution diagrams of magnetization directions of corresponding pinning layers in +X-axis magnetoresistive sensing units and −X-axis magnetoresistive sensing units of an extended X-axis linear or angular magnetoresistive sensor. FIG. 6 and FIG. 7 are distribution diagrams of magnetization directions of corresponding pinning layers in +Y-axis magnetoresistive sensing units and −Y-axis magnetoresistive sensing units of an extended Y-axis linear or angular magnetoresistive sensor. The push X-axis magnetoresistive sensing unit comprises an X push magnetically-oriented magnetoresistive sensing unit having a magnetization orientation angle of 0 degrees, or totally 2n types of X push magnetically-oriented magnetoresistive sensing units having magnetization orientation angles of $(+\theta 11, -\theta 11)$, $(+\theta 12, -\theta 12)$, ..., $(+\theta 1n, -\theta 1n)$ degrees, or totally 2n+1 types of X push magnetically-oriented magnetoresistive sensing units having magnetization orientation angles of 0, $(+\theta 11, -\theta 11)$, $(+\theta 12, -\theta 12)$, ..., $(+\theta 1n, -\theta 1n)$ degrees; the pull X-axis magnetoresistive sensing unit comprises an X pull magnetically-oriented magnetoresistive sensing unit having a magnetization orientation angle of 180 degrees, or totally 2n types of X pull magnetically-oriented magnetoresistive sensing units having magnetization orientation angles of $(180+\theta 11, 180-\theta 11)$, $(180+\theta 12, 180-\theta 12)$, ..., $(180+\theta 1n, 180-\theta 1n)$ degrees, or totally 2n+1 types of X pull magnetically-oriented magnetoresistive sensing units having magnetization orientation angles of 180, $(180+\theta 11, 180-\theta 11)$, $(180+\theta 12, 180-\theta 12)$, ..., $(180+\theta 1n, 180-\theta 1n)$ degrees; the push Y-axis magnetoresistive sensing unit comprises a Y push magnetically-oriented magnetoresistive sensing unit having a magnetization orientation angle of 90 degrees, or totally 2n types of Y push magnetically-oriented magnetoresistive sensing units having magnetization orientation angles of $(90+\theta 21, 90-\theta 21)$, $(90+\theta 22, 90-\theta 22)$, ..., $(90+\theta 2n, 90-\theta 2n)$ degrees, or totally 2n+1 types of Y push magnetically-oriented magnetoresistive sensing units having magnetization orientation angles of 90, $(90+\theta 21, 90-\theta 21)$, $(90+\theta 22, 90-\theta 22)$, ..., $(90+\theta 2n, 90-\theta 2n)$ degrees; and the pull Y-axis magnetoresistive sensing unit comprises a Y pull magnetically-oriented magnetoresistive sensing unit having a magnetization orientation angle of 270 degrees, or totally 2n types of Y pull magnetically-oriented magnetoresistive sensing units having magnetization orientation angles of $(270+\theta 21, 270-\theta 21)$, $(270+\theta 22, 270-\theta 22)$, ..., $(270+\theta 2n, 270-\theta 2n)$ degrees, or totally 2n+1 types of Y pull magnetically-oriented magnetoresistive sensing units having magnetization orientation angles of 270, $(270+\theta 21, 270-\theta 21)$, $(270+\theta 22, 270-\theta 22)$, ..., $(270+\theta 2n, 270-\theta 2n)$ degrees, wherein the values of $\theta 11, \theta 12, \ldots, \theta 1n, \theta 21, \theta 22, \ldots, \theta 2n$ are respectively between 0 and 90 degrees, and n is a positive integer greater than or equal to 1.

Figure 8:
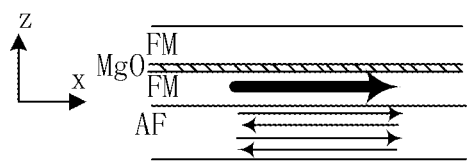
FIG. 8 is a schematic diagram 1 of a multi-stack layer structure of a TMR magnetoresistive sensing unit.
Figure 9:
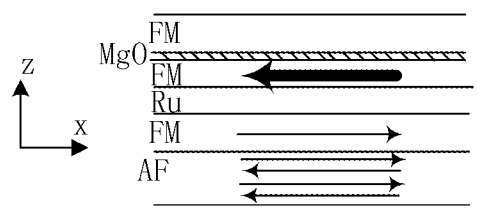
FIG. 9 is a schematic diagram 2 of a multi-stack layer structure of a TMR magnetoresistive sensing unit.
Figure 10:
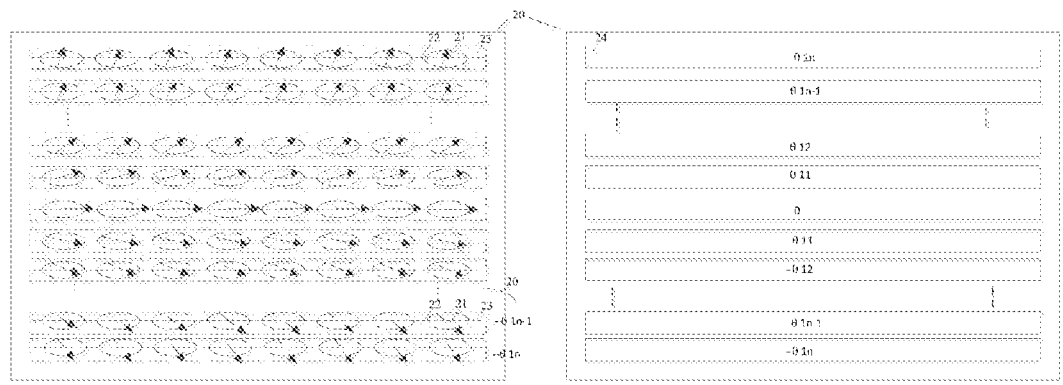
FIG. 10 is a distribution diagram of +X push arm magnetically-oriented magnetoresistive sensing units and magnetoresistive orientation groups thereof.
Figure 11:
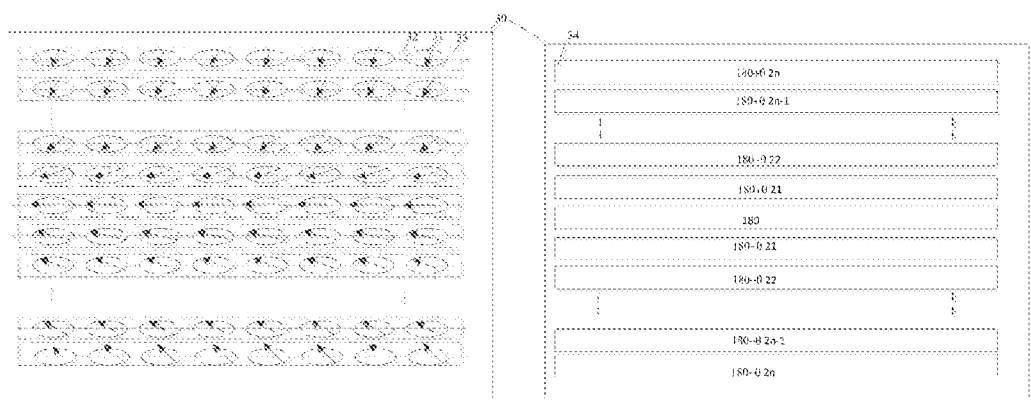
FIG. 11 is a distribution diagram of −X pull arm magnetically-oriented magnetoresistive sensing units and magnetoresistive orientation groups thereof.
Figure 12:
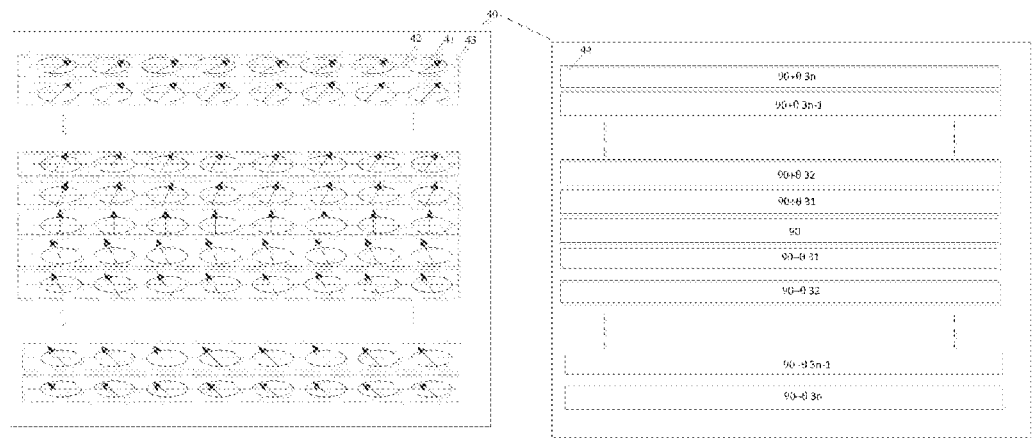
FIG. 12 is a distribution diagram of +Y push arm magnetically-oriented magnetoresistive sensing units and magnetoresistive orientation groups thereof.
Figure 13:
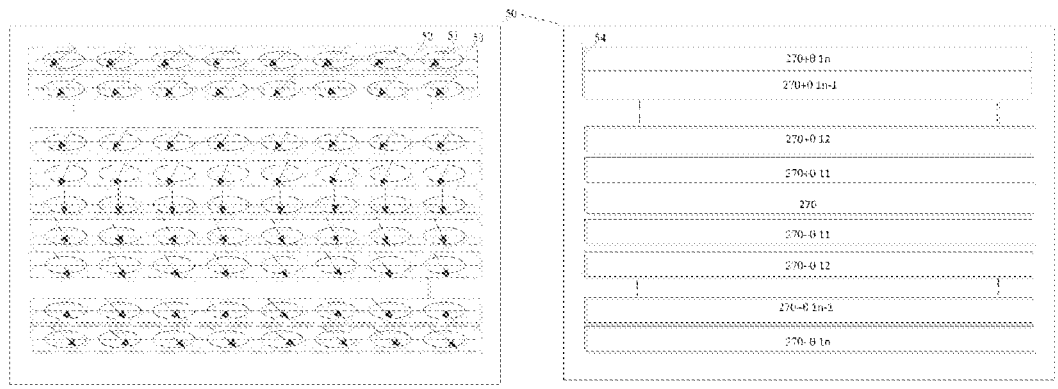
FIG. 13 is a distribution diagram of −Y pull arm magnetically-oriented magnetoresistive sensing units and magnetoresistive orientation groups thereof.

The magnetoresistive sensing unit comprises a ferromagnetic free layer/a nonmagnetic isolation layer/a single layer stack-structured ferromagnetic reference layer, or the magnetoresistive sensing unit comprises a ferromagnetic free layer/a nonmagnetic isolation layer/a multilayer film-structured ferromagnetic reference layer. FIG. 8 and FIG. 9 are two multilayer film structures, i.e., single-stack layer and multi-stack layer, of ferromagnetic reference layers of TMR magnetoresistive sensing units corresponding to +X-axis and −X-axis magnetoresistive sensing units, wherein the single layer stack-structured ferromagnetic reference layer is an antiferromagnetic layer/ferromagnetic reference layer, and the multilayer film-structured ferromagnetic reference layer is an antiferromagnetic layer/n intermediate layers/ferromagnetic reference layer, wherein the intermediate layer is a ferromagnetic layer/metal spacing layer, and n is an integer greater than or equal to 1. It can be seen that, for the +X-axis magnetoresistive sensing unit and −X-axis magnetoresistive sensing unit, the direction of the ferromagnetic reference layer can be controlled by controlling the magnetization direction of the antiferromagnetic (AF) layer, and the +X-axis magnetoresistive sensing unit and −X-axis magnetoresistive sensing unit have +X and −X opposite magnetization directions of the antiferromagnetic layers. Similarly, +Y and −Y magnetoresistive sensing units can be realized by only controlling the magnetization directions of the single-stack layer or multi-stack layer in the +Y or −Y direction.

FIG. 10, FIG. 11, FIG. 12 and FIG. 13 are respectively distribution diagrams of +X-axis, −X-axis, +Y-axis and −Y-axis magnetoresistive sensing units and magnetoresistive orientation groups thereof, wherein, for the arrangement method 20 of the +X-axis magnetoresistive sensing units, the magnetoresistive sensing units 21 having the same magnetization orientation angle are arranged as magnetoresistive sensing unit strings 22, the magnetoresistive sensing unit strings having the same magnetization orientation angle form a magnetoresistive orientation group 23, and 20 comprises 2n+1 magnetoresistive orientation groups having magnetization orientation angles of 0, (+$\theta$11, −$\theta$11), (+$\theta$12, −$\theta$12), . . . , (+$\theta$1n−1, −$\theta$1n−1), (+$\theta$1n, −$\theta$1n) degrees; for the arrangement method 30 of the −X-axis magnetoresistive sensing units, the magnetoresistive sensing units 31 having the same magnetization orientation angle are arranged as magnetoresistive sensing unit strings 32, the magnetoresistive sensing unit strings having the same magnetization orientation angle form a magnetoresistive orientation group 33, and 30 comprises 2n+1 magnetoresistive orientation groups having magnetization orientation angles of 180, (180+$\theta$11, 180−$\theta$11), (180+$\theta$12, 180−$\theta$12), . . . , (180+$\theta$1n−1, 180−$\theta$1n−1), (180+$\theta$1n, 180−$\theta$1n) degrees; for the arrangement method 40 of the +Y-axis magnetoresistive sensing units, the magnetoresistive sensing units 41 having the same magnetization magnetic orientation angle are arranged as magnetoresistive sensing unit strings 42, the magnetoresistive sensing unit strings having the same magnetic orientation angle form a magnetoresistive orientation group 43, and 40 comprises 2n+1 magnetoresistive orientation groups having magnetic orientation angles of 90, (90+$\theta$11, 90−$\theta$11), (90+$\theta$12, 90−$\theta$12), . . . , (90+$\theta$1n−1, 90−$\theta$1n−1), (90+$\theta$1n, 90−$\theta$1n) degrees; and for the arrangement method 50 of the −Y-axis magnetoresistive sensing units, the magnetoresistive sensing units 51 having the same magnetic orientation angle are arranged as magnetoresistive sensing unit strings 52, the magnetoresistive sensing unit strings having the same magnetic orientation angle form a magnetoresistive orientation group 53, and 50 comprises 2n+1 magnetoresistive orientation groups having magnetic orientation angles of 270, (270+$\theta$11, 270−$\theta$11), (270+$\theta$12, 270−$\theta$12), . . . , (270+$\theta$1n−1, 270−1n−1), (270+$\theta$1n, 270−$\theta$1n) degrees, wherein the values of $\theta$11, $\theta$12, . . . , $\theta$1n, $\theta$21, $\theta$22, . . . , $\theta$2n are respectively between 0 and 90 degrees, and n is a positive integer greater than or equal to 1. For the sake of simplicity, the magnetoresistive orientation groups such as 23, 33, 43 and 53 are respectively expressed by using corresponding long strips 24, 34, 44 and 54, and the magnetic orientation angle values thereof are marked.

Further, various corresponding magnetically-oriented magnetoresistive sensing units of the +X-axis, −X-axis, +Y-axis and −Y-axis magnetoresistive sensing units illustrated in FIG. 10-13 form a magnetoresistive orientation group. The magnetoresistive sensing units are connected to form X push arms, X pull arms, Y push arms and Y pull arms, and then the bridge arms are connected to form a push-pull magnetoresistive sensor bridge illustrated in FIG. 14: a single-axis X push-pull linear or angular magnetoresistive sensor bridge or a double-axis X-Y push-pull linear or angular magnetoresistive sensor bridge.

Figures 14, 14A:
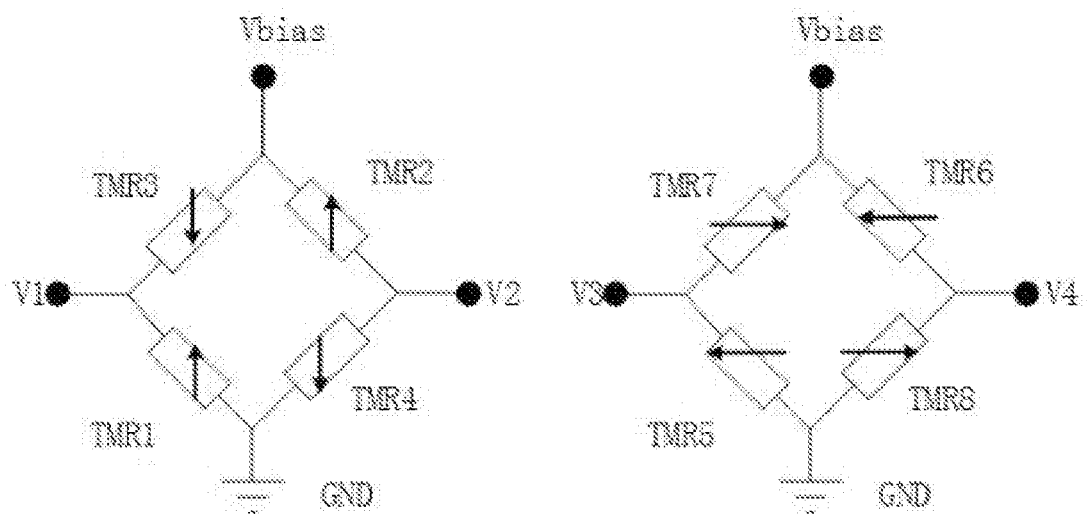

FIG. 14 is the a diagram of a full-bridge structure of the push-pull double-axis magnetoresistive sensor, wherein in FIG. 14(a), Vbias and GND respectively correspond to the power end and ground end of the push-pull Y-axis magnetoresistive sensor; and in FIG. 14(b), Vbias and GND respectively correspond to the power end and ground end of the push-pull X-axis magnetoresistive sensor, V1 and V2 are respectively the full-bridge signal output ends of the push-pull Y-axis magnetoresistive sensor, V3 and V4 are respectively the full-bridge signal output ends of the push-pull X-axis magnetoresistive sensor, the Y-axis push-pull magnetoresistive sensor comprises two Y booms, i.e., TMR3 and TMR4, and further comprises two Y pull arms, i.e., TMR1 and TMR2, the X-axis push-pull magnetoresistive sensor comprises two X push arms, i.e., TMR5 and TMR6, and two X pull arms, i.e., TMR7 and TMR8. In addition to the push-pull full bridge, a push-pull half half-bridge or a quasi-bridge structure may also be formed.

Embodiment 2

Figure 15A:
FIGS. 15(a) and 15(b) are distribution diagrams of isolated type magnetoresistive orientation groups of a single-axis X push-pull half-bridge magnetoresistive sensor.
Figure 15B:
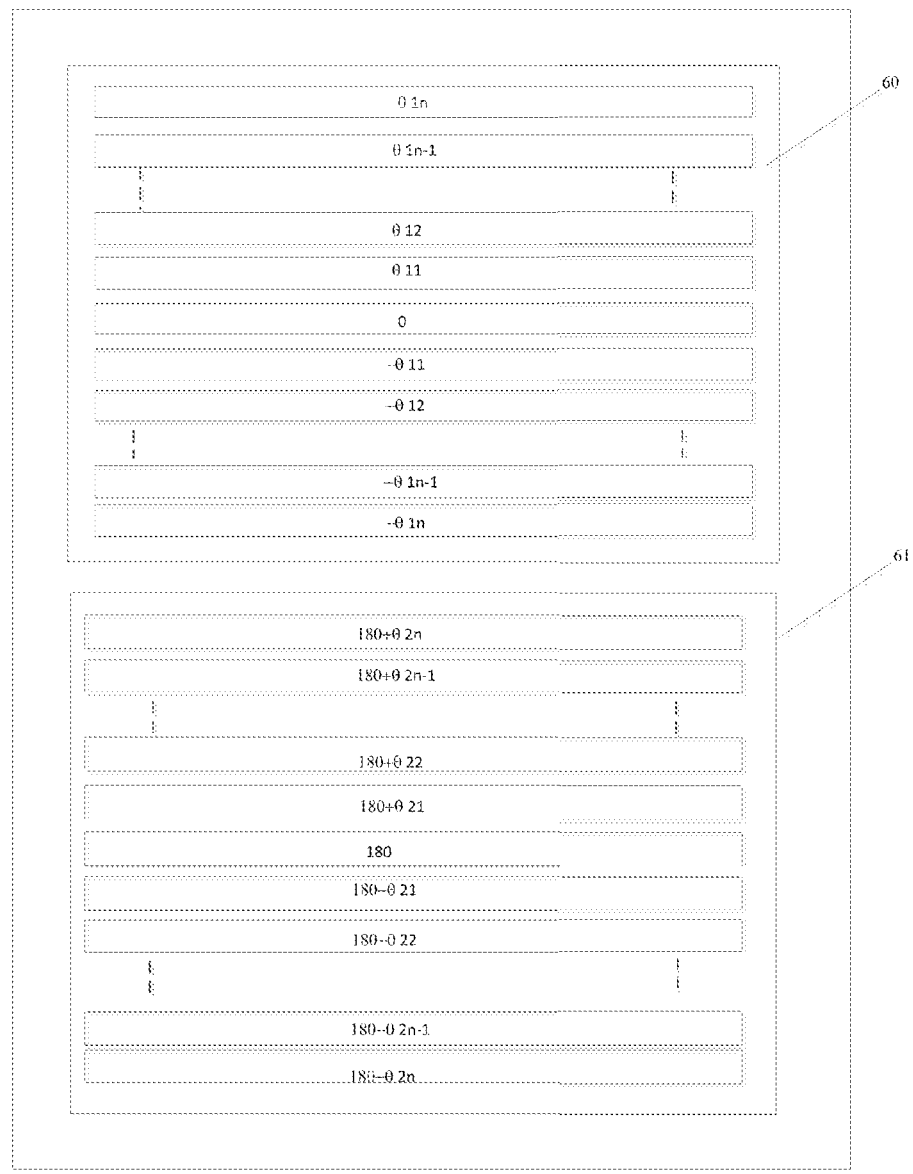

FIG. 15 and FIG. 16 are two typical arrangement methods of a single-axis X push-pull magnetoresistive sensor half bridge on a die. FIG. 15 is an isolated type arrangement method. As illustrated in FIG. 15(a), the +X oriented magnetoresistive sensing unit groups corresponding to the X push arm and the −X oriented magnetoresistive sensing unit groups corresponding to the X pull arm are separately arranged to form two rows and one column or two columns and one row. FIG. 15(a) gives a two-row and one-column arrangement method: X push arm/X pull arm, the arrangement of the magnetoresistive orientation groups are illustrated in FIG. 15(b), the X push series, i.e., $\theta$1n series magnetoresistive orientation group 60 and X pull series, i.e., $\theta$2n series magnetoresistive orientation group 61, are isolated from each other and are in parallel with the direction of row.

Figure 16A:
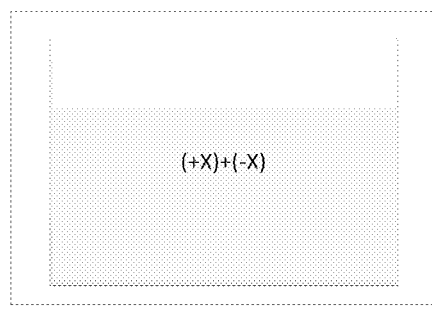
FIG. 16(a)-16(c) are distribution diagrams of mixed type magnetoresistive orientation groups of a single-axis X push-pull half-bridge magnetoresistive sensor.
Figure 16B:
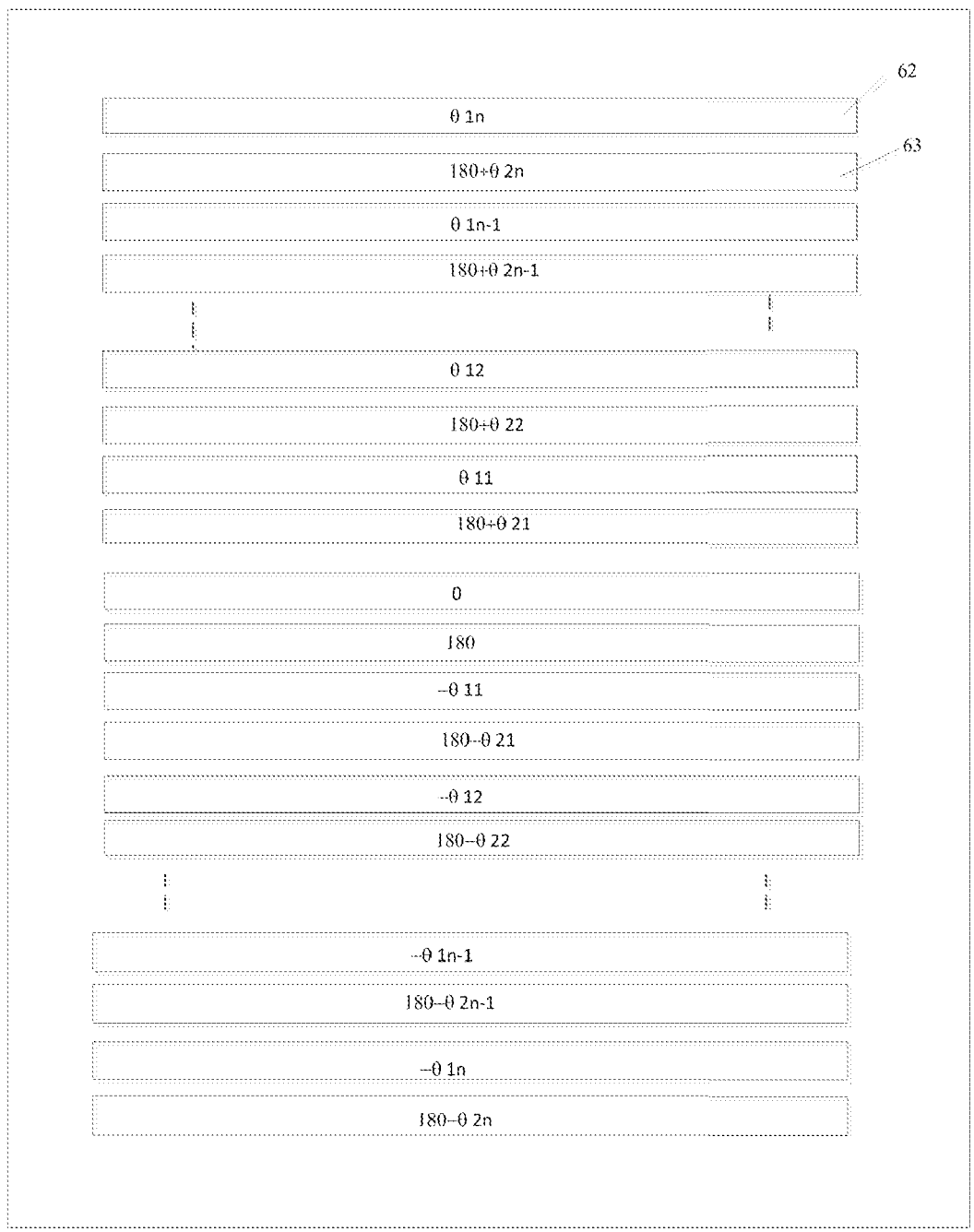
Figure 16C:
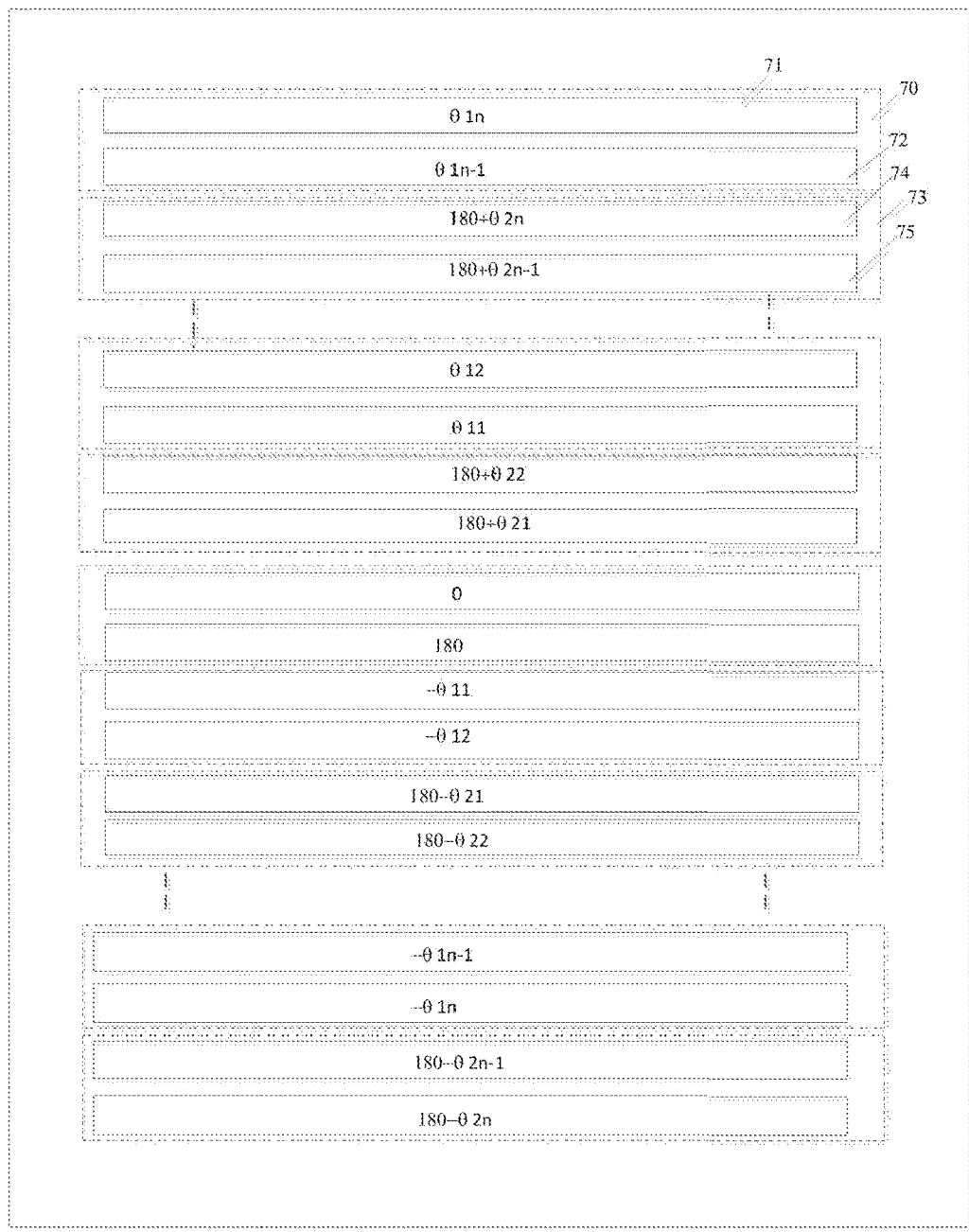

FIG. 16 is a hybrid arrangement method. Rectangles corresponding to (+X)+(−X) in FIG. 16(a) represent mixed arrangement. FIG. 16(b) and FIG. 16(c) are two typical mixed arrangement methods of $\theta$1n series and $\theta$2n series magnetoresistive orientation groups, wherein in FIG. 16(b), each magnetoresistive orientation group $\theta$1i such as 62 in $\theta$1n series and each magnetoresistive orientation group $\theta$2i such as 63 in $\theta$2n series form mixed arrangement of $\theta$1i/$\theta$2i such as 62/63, while in FIG. 16(c), each magnetoresistive orientation group $\theta$1i and $\theta$2i series in $\theta$1n series firstly is divided into two or more push orientation subunits such as 70 and pull orientation subunits such as 73, wherein each push orientation subunit such as 70 comprises one or more push magnetoresistive orientation groups such as 71 and 72, and each pull orientation subunit such as 73 comprises one or more pull magnetoresistive orientation groups such as 74 and 75, and then when the push orientation subunits and pull orientation subunits form mixed arrangement, two adjacent orientation subunits are different and respectively correspond to the push orientation subunit or pull orientation subunit.

Figure 17A:
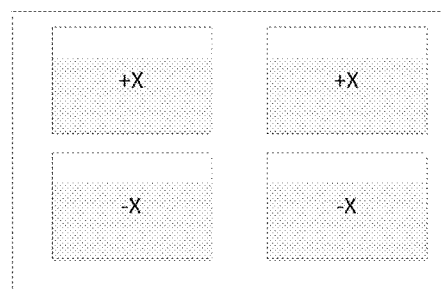
FIG. 17(a)-17(c) are distribution diagrams 1 of isolated type magnetoresistive orientation groups of a single-axis X push-pull full-bridge magnetoresistive sensor.
Figure 17B:
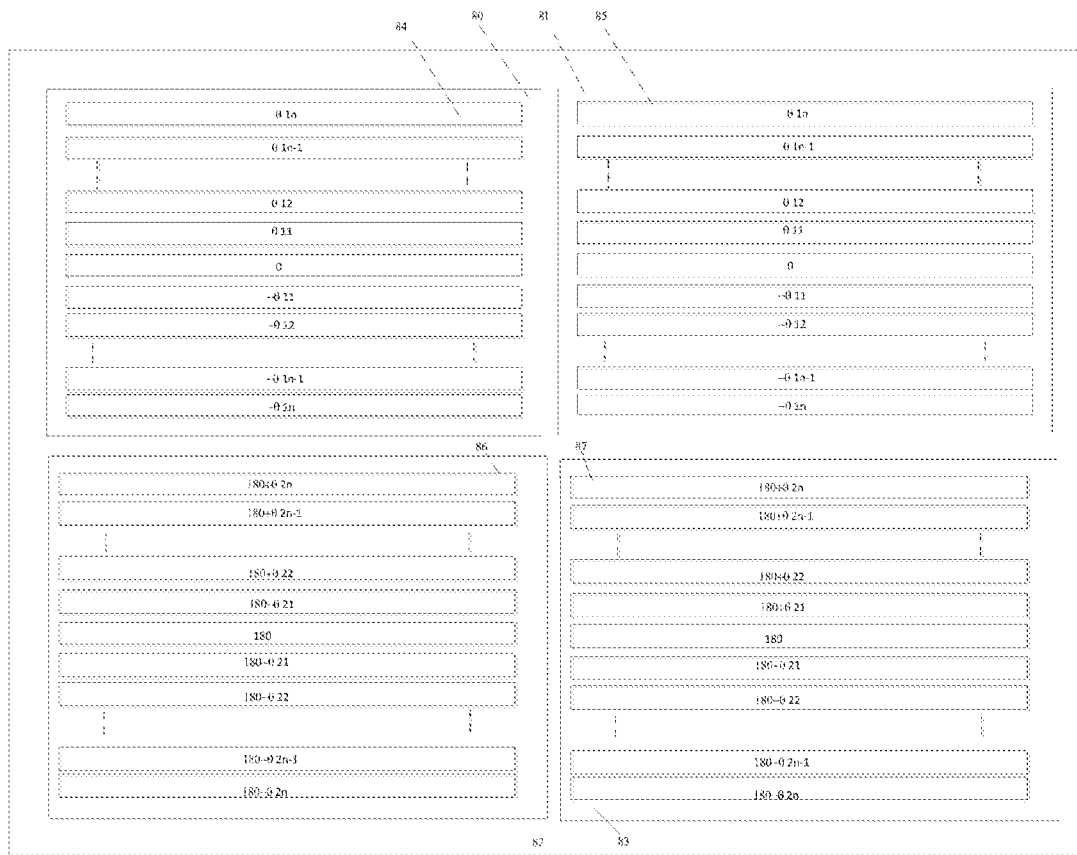
Figure 17C:
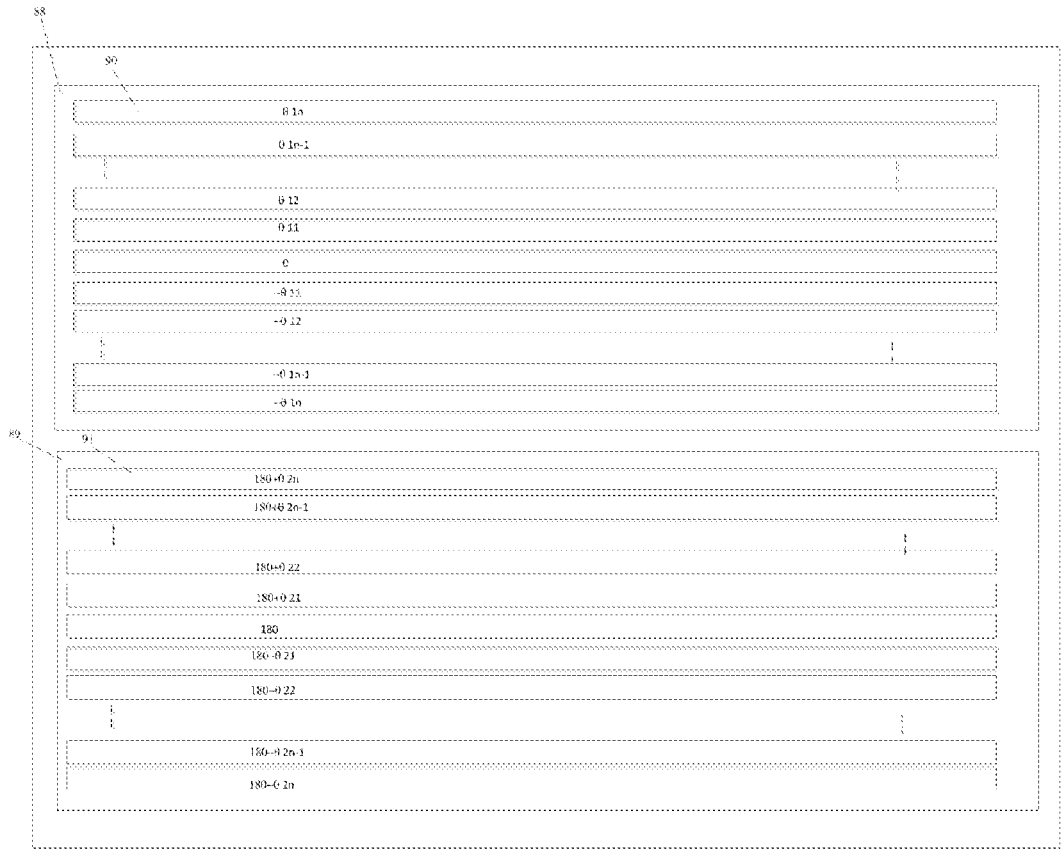
Figure 19:
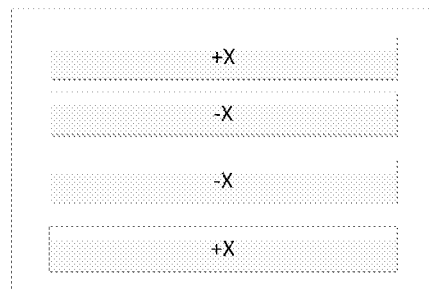
FIG. 19 is a distribution diagram 3 of isolated type magnetic orientation groups of a single-axis X push-pull full-bridge magnetoresistive sensor.
Figure 20:
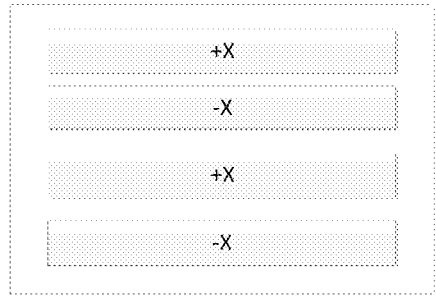
FIG. 20 is a distribution diagram 4 of isolated type magnetic orientation groups of a single-axis X push-pull full-bridge magnetoresistive sensor.
Figure 21:
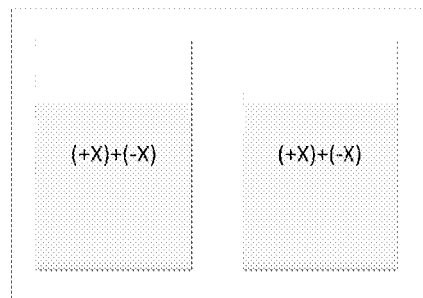
FIG. 21 is a distribution diagram 1 of mixed type magnetic orientation groups of a single-axis X push-pull full-bridge magnetoresistive sensor.
Figure 22:
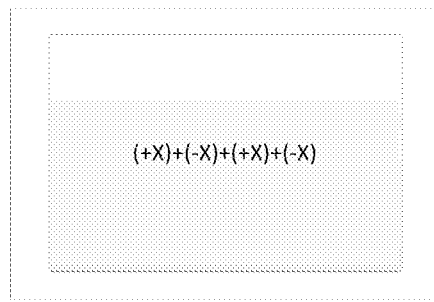
FIG. 22 is a distribution diagram 2 of mixed type magnetic orientation groups of a single-axis X push-pull full-bridge magnetoresistive sensor.

FIG. 17-22 are two typical arrangement methods of the single-axis X push-pull magnetoresistive sensor on the die. FIG. 17-20 are isolated arrangement, and FIG. 21-22 are mixed arrangement, wherein in FIG. 17(a), the X push arms and the X pull arms form a two-row and two-column arrangement method, the two push arms are located in the same row or column, and the two pull arms are located in the other row or column. FIG. 17(b) is arrangement of corresponding two $\theta$1i series 80 and 81 and two $\theta$2i series 82 and 83 magnetoresistive orientation groups, the equivalent magnetoresistive orientation groups corresponding to the two θ1i series magnetoresistive orientation groups 80 and 81 correspond to each other one to one as 84 and 85, are in parallel with each other and are located in the same row or column, and similarly, the equivalent magnetoresistive orientation groups corresponding to the two θ2i series magnetoresistive orientation groups 82 and 83 correspond to each other one to one as 86 and 87, are in parallel with each other and are located in the same row or column. Further, as illustrated in FIG. 17(*c*), two θ1i series magnetoresistive orientation groups in the same row are combined to form a new θ1i series magnetoresistive orientation group 88. In FIG. 17(*b*), two equivalent magnetic orientation groups 84 and 85 in the same row or column are combined to form a new equivalent magnetic orientation group 90 along the direction of the same row or column, two θ2i series magnetoresistive orientation groups in the same row are combined to form a new θ2i series magnetoresistive orientation group 89, and two equivalent magnetoresistive orientation groups 86 and 87 in the same row or column are combined to form a new equivalent magnetoresistive orientation group 91 along the direction of the same row or column. The combination of the two equivalent magnetoresistive orientation groups is longitudinal combination.

Figure 18A:
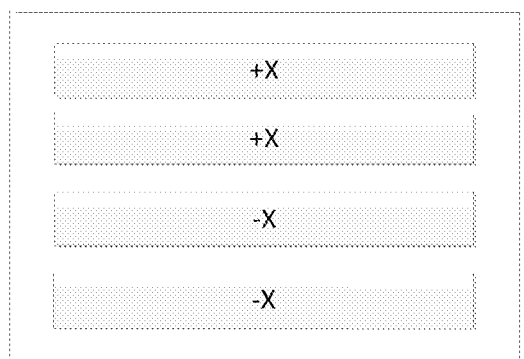
FIG. 18(a)-18(c) are distribution diagrams 2 of isolated type magnetoresistive orientation groups of a single-axis X push-pull full-bridge magnetoresistive sensor.
Figure 18B:
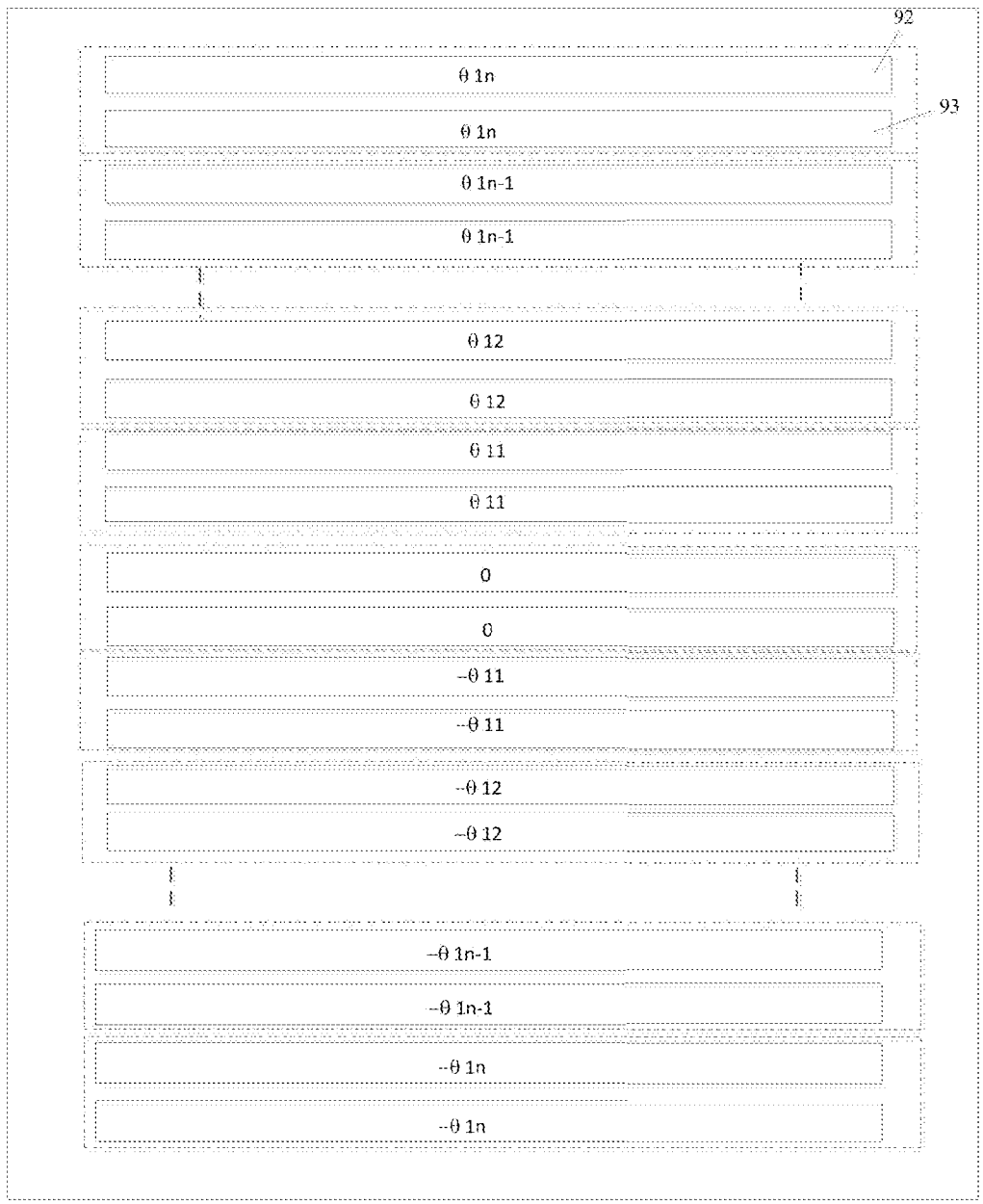
Figure 18C:
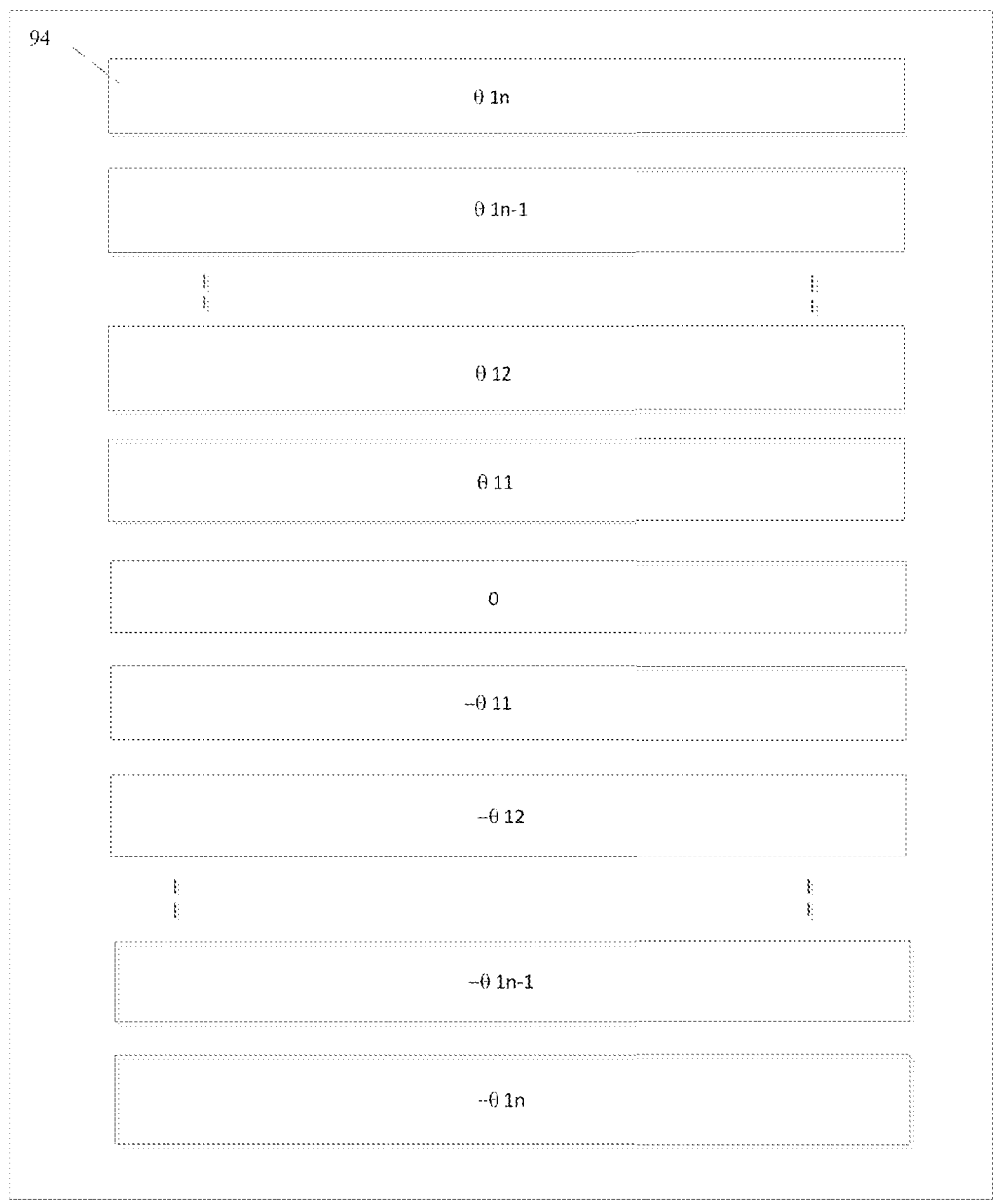

FIG. 18 is a structure that X push arms and X pull arms are arranged in four rows and one column or four columns and one row. FIG. 18(*a*) is arrangement of X push arm/X push arm/X pull arm/X pull arm, wherein the two X push arm/X push arm, X pull arm/X pull arm may be combined to form a new X push arm and X pull arm. FIG. 18(*b*) is a combination situation of θ1i series magnetoresistive orientation groups corresponding to the corresponding X push arm/X push arm, wherein the two equivalent magnetoresistive orientation groups 92 and 93 are located in two adjacent rows in the same column, are in parallel with each and are combined to form a new equivalent magnetic orientation group 94 illustrated in FIG. 18(*c*). Thus, the X push arm/X push arm and X pull arm/X pull arm are combined to form a new X push arm and X pull arm, and the combination of the two equivalent magnetoresistive orientation groups is transverse combination.

FIG. 19-20 are other types of isolated arrangement of two X push arms and two X pull arms, wherein FIG. 19 is X push arm/X pull arm/X pull arm/X push arm, and FIG. 20 is X push arm/X pull arm/X push arm/X pull arm.

FIG. 21 and FIG. 22 are mixed arrangement, wherein in FIG. 21, an array of two columns and one row or two rows and one column is formed, one X push arm and one X pull arm form a mixed structure, the other X push arm and the other X pull arm also form a mixed structure, the two mixed structures are the same, and further, the two mixed structures are longitudinally combined along the direction of the same column or the same row.

In FIG. 22, the two X push arms and two X pull arms are arranged in a mixed manner along the direction of the same column or the same row.

Figure 23:
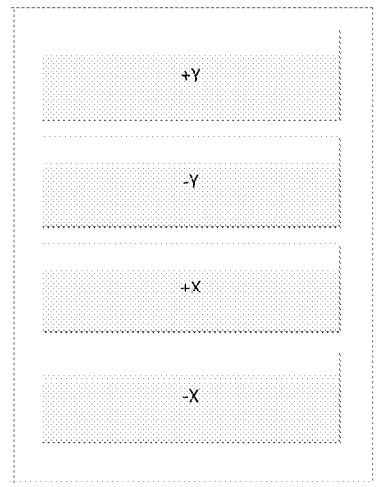
FIG. 23 is a distribution diagram 1 of isolated type magnetic orientation groups of a double-axis X-Y push-pull half-bridge magnetoresistive sensor.
Figure 24:
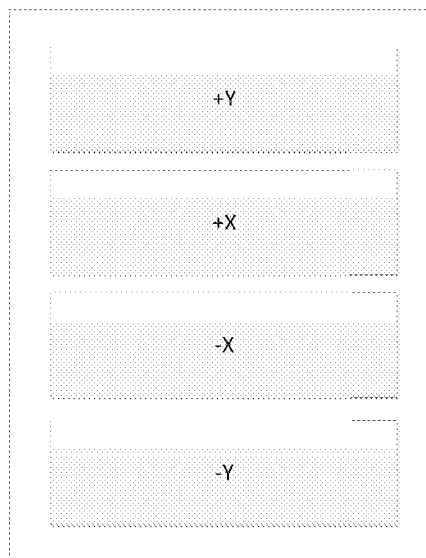
FIG. 24 is a distribution diagram 2 of isolated type magnetic orientation groups of a double-axis X-Y push-pull half-bridge magnetoresistive sensor.
Figure 25:
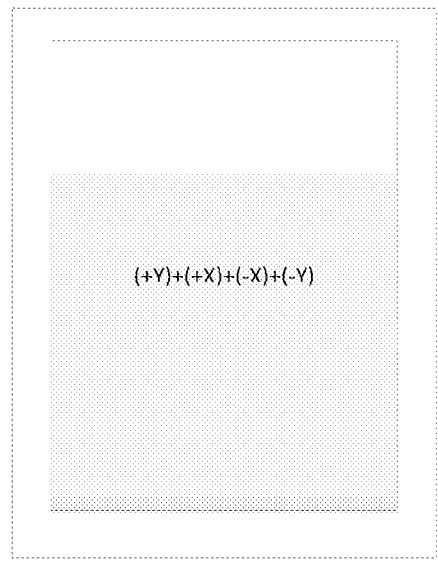
FIG. 25 is a distribution diagram 1 of mixed type magnetic orientation groups of a double-axis X-Y push-pull half-bridge magnetoresistive sensor.

FIG. 23-25 are arrangement diagrams of a double-axis X-Y push-pull half-bridge magnetoresistive sensor. FIG. 23-24 are two isolated type structures, and FIG. 25 is a mixed type structure. In FIG. 23-24, the X push arm, the X pull arm, the Y push arm and the Y pull arm form an array of four rows and one column or four columns and one row. In FIG. 23, the arrangement sequence is Y push arm/Y push arm/X push arm/X pull arm; and in FIG. 24, the arrangement sequence is Y push arm/X push arm/X pull arm/Y pull arm. Besides, other combinations may also be formed. FIG. 25 is a mixed arrangement method, and the X push arm, the X pull arm, the Y push arm and the Y pull arm form a mixed type arrangement.

Figure 26:
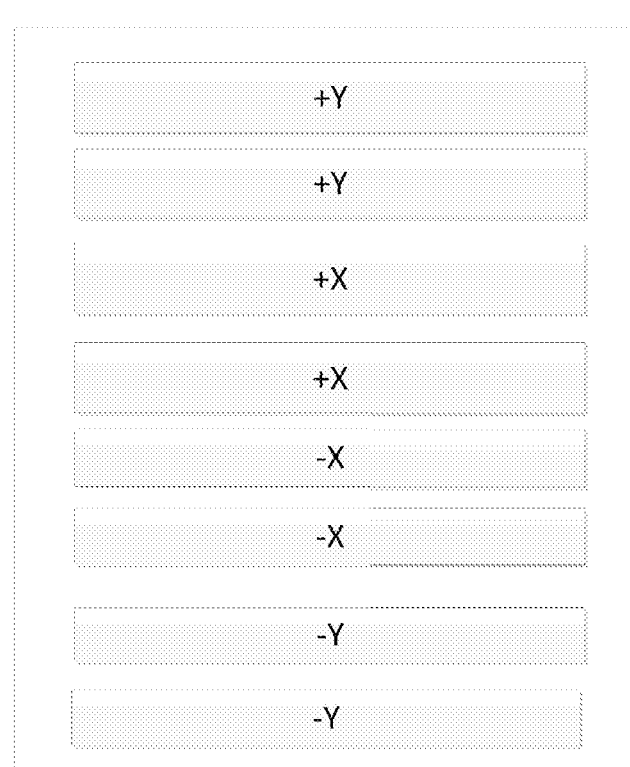
FIG. 26 is a distribution diagram 1 of isolated type magnetic orientation groups of a double-axis X-Y push-pull full-bridge magnetoresistive sensor.
Figure 27:
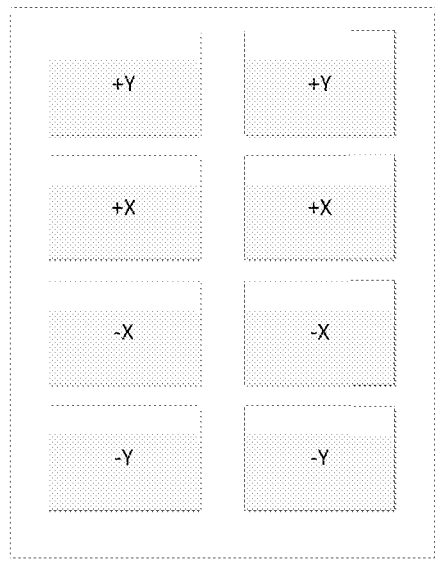
FIG. 27 is a distribution diagram 2 of isolated type magnetic orientation groups of a double-axis X-Y push-pull full-bridge magnetoresistive sensor.
Figure 28:
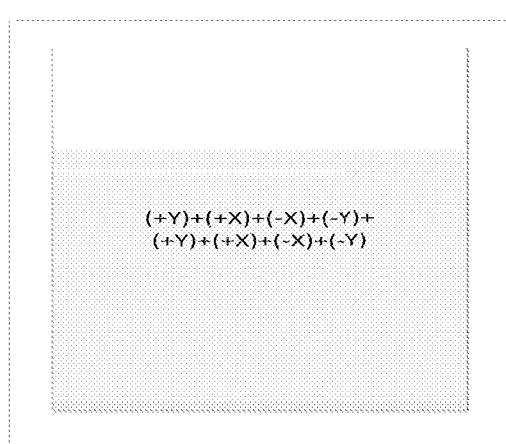
FIG. 28 is a distribution diagram 1 of mixed type magnetic orientation groups of a double-axis X-Y push-pull full-bridge magnetoresistive sensor.
Figure 29:
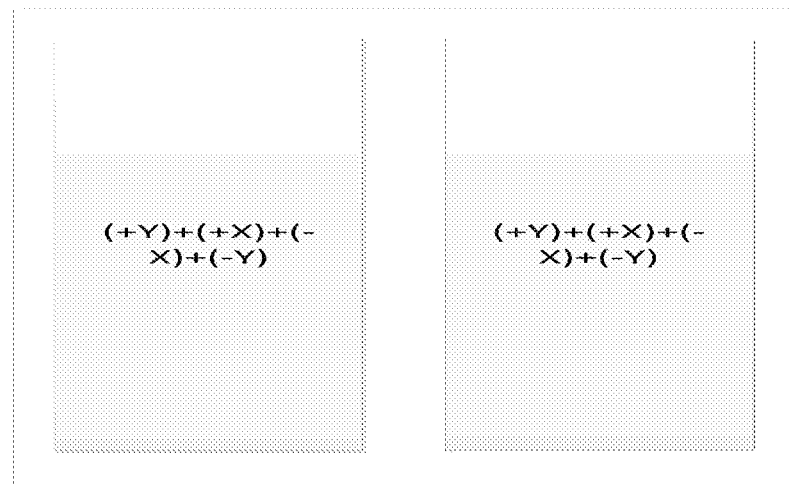
FIG. 29 is a distribution diagram 2 of mixed type magnetic orientation groups of a double-axis X-Y push-pull full-bridge magnetoresistive sensor.

FIG. 26-29 are arrangement diagrams of a double-axis X-Y push-pull full-bridge magnetoresistive sensor. FIG. 26-27 are two typical isolated type structures, and FIG. 28-29 are mixed type structures. In FIG. 26, all X push arms, X pull arms, Y push arms and Y pull arms form a structure of eight rows and one column or eight columns and one row, and the following several structures may be formed: X half bridge/Y full bridge/X half bridge, Y half bridge/X full bridge/Y half bridge, X double push arms/Y full bridge/X double pull arm bridge, and Y double push arms/X full bridge/Y double pull arms, wherein the X half bridge is X push arm/X pull arm, the Y half bridge is Y push arm/Y pull arm, the X full bridge is X push arm/X push arm/X pull arm/X pull arm, X push arm/X pull arm/X push arm/X pull arm, X pull arm/X push arm/X push arm/X pull arm, or X push arm/X pull arm/X pull arm/X push arm, the Y full bridge is Y push arm/Y push arm/Y pull arm/Y pull arm, Y push arm/Y pull arm/Y push arm/Y pull arm, Y pull arm/Y push arm/Y push arm/Y pull arm, or Y push arm/Y pull arm/Y pull arm/Y push arm, the X double push arms are X push arm/X push arm, the X double pull arms are X pull arm/X pull arm, and the Y double push arms are Y push arm/Y push arm. The Y push arm/Y push arm or Y/pull arm/Y pull arm may be transversely combined.

In FIG. 27, the two X push arms, two X pull arms, two Y push arms and two Y pull arms form an array of four rows and two columns, the second row and the third row respectively correspond to the X push arm and X pull arm, the first row and the fourth row respectively correspond to the Y push arm and Y pull arm, or the second row or the third row respectively correspond to the Y push arm and Y pull arm, and the first row and the fourth row respectively correspond to the X push arm and X pull arm, wherein the two X push arm or two X pull arms in the same row or the same column may be longitudinally combined.

FIG. 28 and FIG. 29 are mixed structures. In FIG. 28, the X push arm, X pull arm, Y push arm and Y pull arm of the double-axis X-Y magnetoresistive sensor are mixed in a mixed manner. In FIG. 29, an array of two columns and one row or two rows and one column is formed, wherein one group of X push arm, X pull arm, Y push arm and Y pull arm forms a mixed structure, the other group of X push arm, X pull arm, Y push arm and Y pull arm also forms a mixed structure, and the two mixed structures are longitudinally combined.

Embodiment 3

Figure 30:
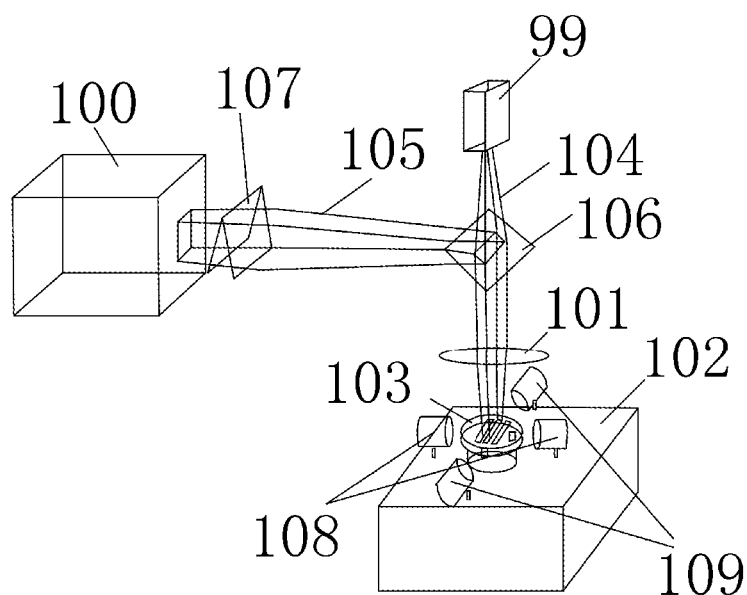
FIG. 30 is a schematic diagram of a magnetic orientation writing system for laser magnetoresistive sensing units.

FIG. 30 is a laser annealing device for setting the orientation of different antiferromagnetic layers of magnetoresistive sensing units of a single-axis X magnetoresistive sensor and a double-axis X-Y magnetoresistive sensor. The device comprises a laser source 100 used for emitting a laser beam 105 aiming at a magnetic film 103, an optical attenuator 107 provided at the rear end of the laser beam 105 emitted through the laser source 100, and a reflecting mirror 106 used for changing the transmission direction of the laser beam 105 attenuated by the optical attenuator 107, a focusing object lens 101 used for focusing the laser beam 105, the direction of which is changed through the reflecting mirror 106, into a spot, a movable platform 102 comprising a clamp for clamping the magnetic film 103, and two electromagnets 108 and 109 in the orthogonal direction. In addition, it further comprises a CCD camera 99, a slit is provided in the reflecting mirror 106, and the CCD camera 99 adjusts the reflecting mirror 106 through the slit in the reflecting mirror to enable the spot to aim at the magnetic film 103, wherein 104 is the light ray entering the CCD camera 99.

Through the laser heating assisted annealing device illustrated in FIG. 30, by moving the movable platform 102, the laser spot directly selects the magnetoresistive sensing unit, and rapidly heats it to a temperature above the blocking temperature of the AF layer. Then, in the cooling process, the bidirectional electromagnets 108 and 109 are activated to directly determine the magnetization direction of the antiferromagnetic layer of each magnetoresistive sensing unit.

Embodiment 4

Figure 31:
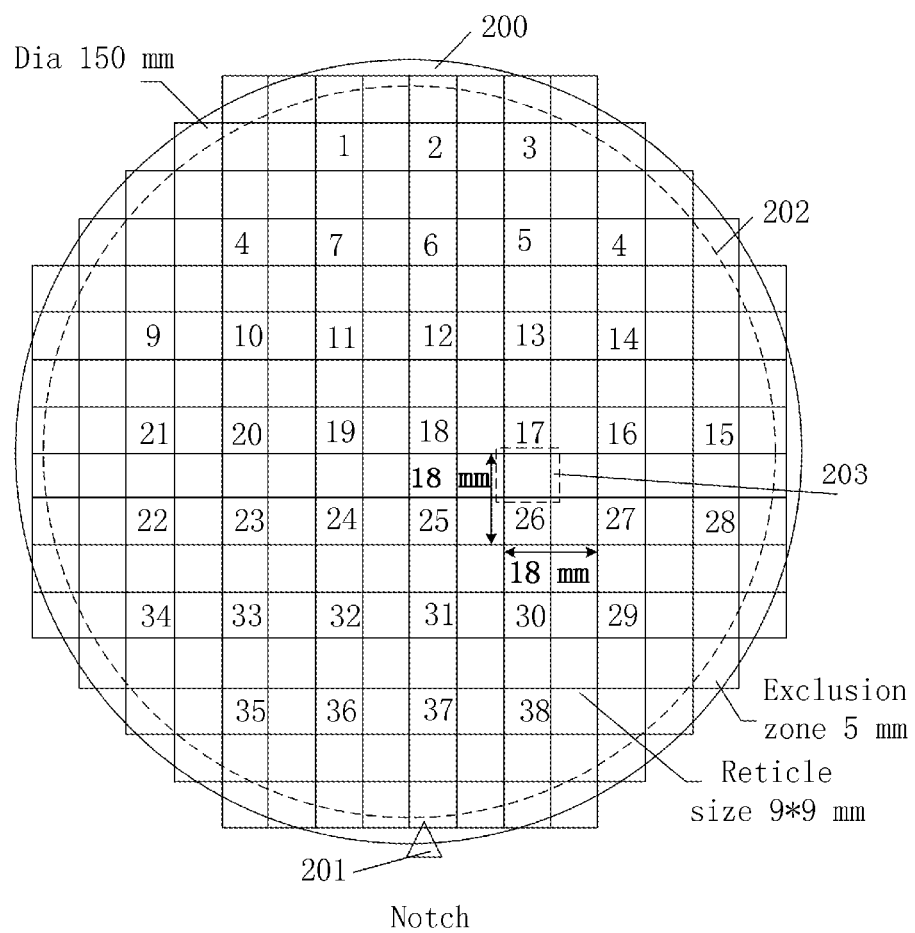
FIG. 31 is a structural diagram of a wafer mask.

FIG. 31 is a mask distribution layout structure corresponding to a wafer. The wafer notch zone corresponding to the wafer 200 is 201, wherein 202 is an exclusion boundary of the wafer, and its outward zone is an exclusion zone and is a zone of about 5 mm, the X-axis magnetoresistive sensor or the double-axis X-Y magnetoresistive sensor is distributed in a 9*9 mm mask zone 203, and then the pattern is transferred in the wafer 200 zone in an array manner to cover the whole effective zone of the wafer, the effective zone of the wafer is the part of the wafer 200 within the exclusion boundary 202. The mask 203 comprises a single-die array of a plurality of single-axis magnetoresistive sensors or double-axis X-Y magnetoresistive sensors, and the single-die array and the magnetoresistive sensing unit array are fully the same.

Embodiment 5

Figure 32:
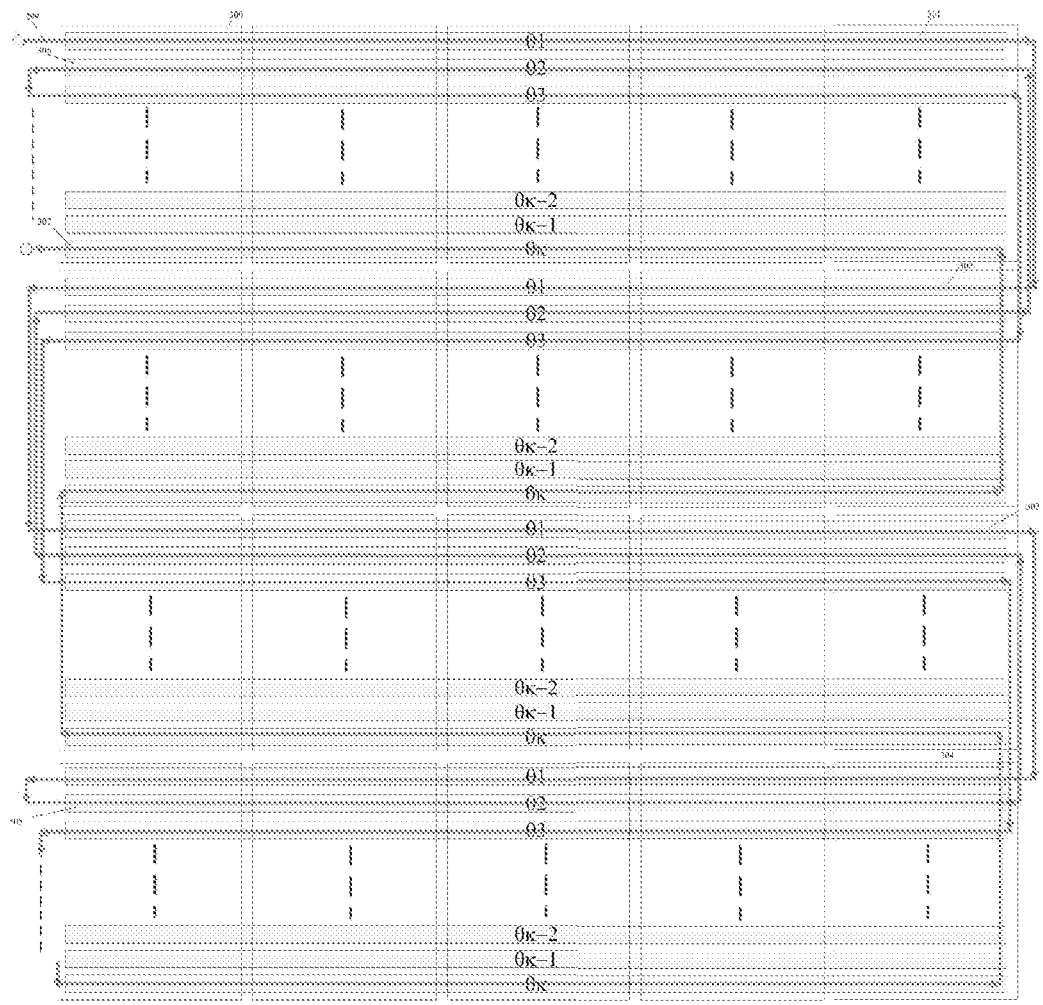
FIG. 32 is a wafer magnetoresistive sensor die array and a laser scanning diagram 1 thereof.
Figure 33:
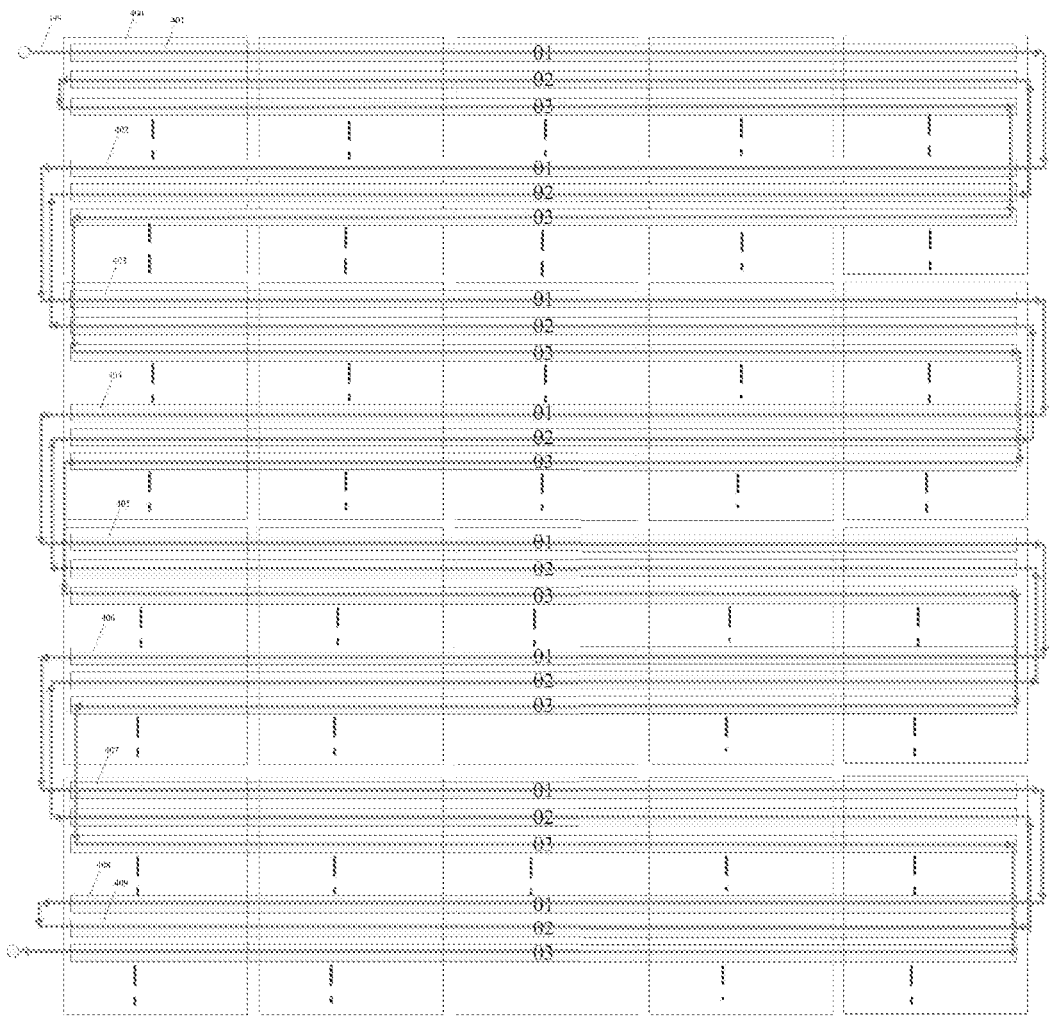
FIG. 33 is a wafer magnetoresistive sensor die array and a laser scanning diagram 2 thereof.
Figure 34:
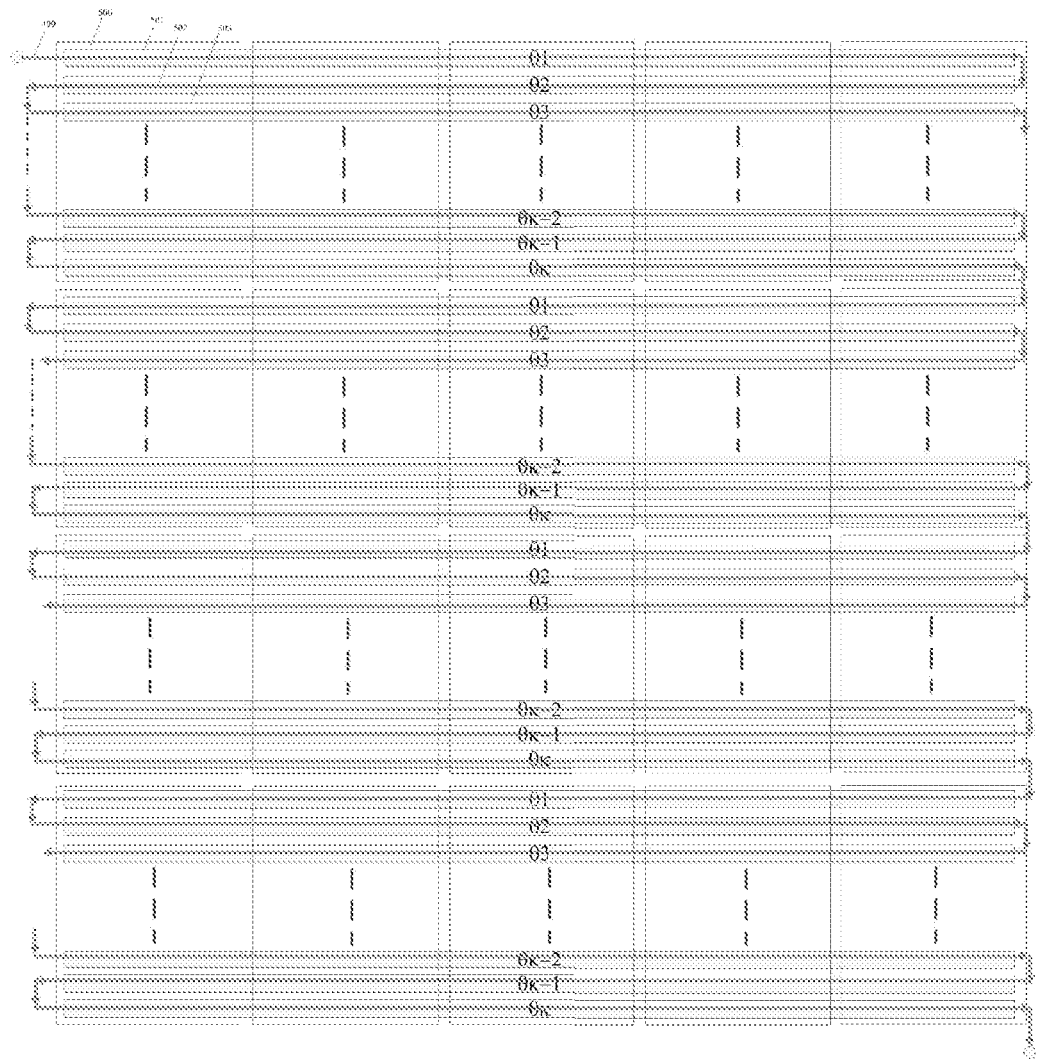
FIG. 34 is a wafer magnetoresistive sensor die array and a laser scanning diagram 3 thereof, In the drawings, 1—magnetoresistive multilayer film, 2—multilayer film structure corresponding to angular magnetoresistive sensor, 3—multilayer film structure corresponding to linear magnetoresistive sensing unit, 4—antiferromagnetic layer, 5—ferromagnetic reference layer, 6—nonmagnetic isolation layer, 7—ferromagnetic free layer, 8—magnetization direction of ferromagnetic reference layer, 9—magnetization direction of ferromagnetic free layer, 10—magnetization direction of ferromagnetic reference layer, 11—magnetization direction of ferromagnetic free layer.

FIG. 32-34 are a die array on a wafer mask, a distribution diagram of magnetoresistive orientation groups and a writing diagram of a laser writing system. Individual dice form a square array, the magnetoresistive sensing units in the dice are arranged into two or more spatially-isolated magnetoresistive orientation groups, each magnetoresistive orientation group is adjacent to the magnetoresistive orientation group having the same orientation angle in at least one adjacent dice.

For the sake of simplicity, the reference signs of the magnetoresistive orientation groups on the wafer are uniformly marked according to the angle value, and the same magnetoresistive orientation group in each row on each die is marked by adopting a long strip, as illustrated in FIG. 32-34.

In FIG. 32, each die 300 totally comprises k magnetoresistive orientation groups from θ1 to θk. Assuming that each magnetic orientation group appears only once in each die, the scanning sequence of the laser 299 is as follows: the scanning starts from the θ1 magnetoresistive orientation group 301 of the dice θ1 in the first row, and then it changes to another row to enter the θ1 magnetoresistive orientation group 302 of the dice in the second row to perform scanning along an opposite direction, then it changes to another row to enter the θ1 magnetoresistive orientation group 303 of the dice in the third row, then the θ1 magnetoresistive orientation group 304 of the dice in the last row is scanned, then it changes to another row to enter the θ2 magnetoresistive orientation group 305 of the dice in the last row to perform scanning upwards row by row, and finally the θ2 magnetoresistive orientation group 306 of the dice in the first row is scanned until the scanning of the last θk magnetoresistive orientation group is completed.

FIG. 33 is another situation, in which each die 400 comprises spaced θ1, θ2 and θ3 magnetoresistive orientation groups such as 401 and 402 which are spaced apart. At this time, the scanning sequence of the laser 399 is as follows: firstly, the first-row θ1 magnetoresistive orientation group 401 of the dice in the first row is scanned, then it changes to another row to scan the second-row θ1 magnetoresistive orientation group 402 in an opposite direction until the scanning of all θ1 magnetoresistive orientation groups of the dice in the first row is completed, then the θ1 magnetoresistive orientation groups 403, 404 of the dice in the second row are scanned, the θ1 magnetoresistive orientation groups 405, 406 of the dice in the third row are scanned, the θ1 magnetoresistive orientation groups 407, 408 of the dice in the last row are scanned, and finally the θ1 magnetoresistive orientation group 409 is scanned from the dice in the last row until the scanning of the θ2 magnetoresistive orientation group in the dice in the first row is completed.

FIG. 34 is a row-by-row scanning method, in which the laser 499 scans the magnetoresistive orientation groups from top to bottom according to the number of rows of the dice 500 without distinguishing the magnetoresistive orientation groups. Scanning is performed downwards according to the sequence of 501, 502, and 503 from top to bottom till the last row, followed by the next row of dice till the last row of dice. Thus, under the situation of mixing that may exist, repetitive operations need to be performed to the magnetoresistive sensing units having the same θ magnetic orientation angle value, and thereby the frequency of adjusting the direction of the magnetic field by the laser writing system is increased.

The above described embodiments are only preferred embodiments of the present invention and are not used for limiting the scope of the present invention. For one skilled in the art, the present invention may be achieved though various modifications and changes. Any modification, equivalent replacement, improvement and the like made within the spirit and principle of the invention shall be included in the protection scope of the present invention.

The invention claimed is:

1. A magnetoresistive sensor wafer layout used for a laser writing system comprising a plurality of rectangular dice forming an array and the surface of the dice is provided with a magnetoresistive multilayer film,
    wherein the magnetoresistive multilayer film comprises antiferromagnetic layers,
    wherein the magnetoresistive multilayer film is patterned into magnetoresistive sensing units,
    wherein the antiferromagnetic layers of the magnetoresistive sensing units are magnetically oriented and directionally aligned through the laser writing system,
    wherein the magnetoresistive sensing units are electrically connected to form bridge arms which are electrically connected to form a magnetoresistive sensor,
    wherein the magnetoresistive sensing units are arranged to form at least two spatially-isolated magnetoresistive orientation groups,
    wherein in each magnetoresistive orientation group, the magnetization orientation angle of the antiferromagnetic layers of the magnetoresistive sensing units is the same,
    wherein the range of the magnetization orientation angle is 0 to 360 degrees,
    wherein the magnetization orientation angles of two adjacent magnetoresistive orientation groups are different, wherein each magnetoresistive orientation group is adjacent to the magnetoresistive orientation group having the same magnetization orientation angle in at least one adjacent dice.

2. The magnetoresistive sensor wafer layout used for the laser writing system according to claim 1,
wherein the magnetoresistive sensing unit comprises:
a TMR sensing unit or GMR spin-valve sensing unit,
a ferromagnetic free layer/a nonmagnetic isolation layer/a single layer stack-structured ferromagnetic reference layer, or
a ferromagnetic free layer/a nonmagnetic isolation layer/a multilayer film-structured ferromagnetic reference layer,
wherein the single layer stack-structured ferromagnetic reference layer is an antiferromagnetic layer/ferromagnetic reference layer, and the multilayer film-structured ferromagnetic reference layer is an antiferromagnetic layer/n intermediate layers/ferromagnetic reference layer,
wherein the intermediate layer is a ferromagnetic layer/metal spacing layer, and n is an integer greater than or equal to 1.

3. The magnetoresistive sensor wafer layout used for the laser writing system according to claim 1,
wherein the magnetoresistive sensor is a linear magnetoresistive sensor or an angular magnetoresistive sensor, and when no external magnetic field is applied, the magnetization direction of the ferromagnetic free layer of the magnetoresistive sensing unit corresponding to the linear magnetoresistive sensor is set by one or more means of permanent magnet biasing, double exchange effect and shape anisotropy.

4. The magnetoresistive sensor wafer layout used for the laser writing system according to claim 1,
wherein the magnetoresistive sensor is a single-axis X push-pull magnetoresistive sensor or a double-axis X-Y push-pull magnetoresistive sensor,
wherein the single-axis X push-pull magnetoresistive sensor and the double-axis X-Y push-pull magnetoresistive sensor are of a full-bridge, half-bridge or quasi-bridge structure, respectively,
wherein the single-axis X push-pull magnetoresistive sensor comprises a single-axis X linear magnetoresistive sensor and a single-axis X angular magnetoresistive sensor,
wherein the double-axis X-Y push-pull magnetoresistive sensor comprises a double-axis X-Y linear magnetoresistive sensor and a double-axis X-Y angular magnetoresistive sensor,
wherein the single-axis X linear magnetoresistive sensor and the single-axis X angular magnetoresistive sensor each comprise an X push arm and an X pull arm,
wherein the double-axis X-Y linear magnetoresistive sensor and the double-axis X-Y angular magnetoresistive sensor each comprise an X push arm, an X pull arm, a Y push arm and a Y pull arm,
wherein the X push arm comprises a push X-axis magnetoresistive sensing unit,
wherein the X pull arm comprises a pull X-axis magnetoresistive sensing unit,
wherein the Y push arm comprises a push Y-axis magnetoresistive sensing unit, and
wherein the Y pull arm comprises a pull Y-axis magnetoresistive sensing unit.

5. The magnetoresistive sensor wafer layout used for the laser writing system according to claim 4,
wherein the push X-axis magnetoresistive sensing unit comprises an X push magnetically-oriented magnetoresistive sensing unit having a magnetization orientation angle of 0 degrees, or totally 2n types of X push magnetically-oriented magnetoresistive sensing units having magnetization orientation angles of (+$\theta 11$, −$\theta 11$), (+$\theta 12$, −$\theta 12$), . . . , (+$\theta 1n$, −$\theta 1n$) degrees, or totally 2n+1 types of types of X push magnetically-oriented magnetoresistive sensing units having magnetization orientation angles of 0, (+$\theta 11$, −$\theta 11$), (+$\theta 12$, −$\theta 12$), . . . , (+$\theta 1n$, −$\theta 1n$) degrees;
wherein the pull X-axis magnetoresistive sensing unit comprises an X pull magnetically-oriented magnetoresistive sensing unit having a magnetization orientation angle of 180 degrees, or totally 2n types of types of X pull magnetically-oriented magnetoresistive sensing units having magnetization orientation angles of (180+$\theta 11$, 180−$\theta 11$), (180+$\theta 12$, 180−$\theta 12$), . . . , (180+$\theta 1n$, 180−$\theta 1n$) degrees, or totally 2n+1 types of types of X pull magnetically-oriented magnetoresistive sensing units having magnetization orientation angles of 180, (180+$\theta 11$, 180−$\theta 11$), (180+$\theta 12$, 180−$\theta 12$), . . . , (180+$\theta 1n$, 180−$\theta 1n$) degrees;
wherein the push Y-axis magnetoresistive sensing unit comprises a Y push magnetically-oriented magnetoresistive sensing unit having a magnetization orientation angle of 90 degrees, or totally 2n types of Y push magnetically-oriented magnetoresistive sensing units having magnetization orientation angles of (90+$\theta 21$, 90−$\theta 21$), (90+$\theta 22$, 90−$\theta 22$), . . . , (90+$\theta 2n$, 90−$\theta 2m$) degrees, or totally 2n+1 types of types of Y push magnetically-oriented magnetoresistive sensing units having magnetization orientation angles of 90, (90+$\theta 21$, 90−$\theta 21$), (90+$\theta 22$, 90−$\theta 22$), . . . , (90+$\theta 2n$, 90−$\theta 2n$) degrees;
wherein the pull Y-axis magnetoresistive sensing unit comprises a Y pull magnetically-oriented magnetoresistive sensing unit having a magnetization orientation angle of 270 degrees, or totally 2n types of Y pull magnetically-oriented magnetoresistive sensing units having magnetization orientation angles of (270+$\theta 21$, 270−$\theta 21$), (270+$\theta 22$, 270−$\theta 22$), . . . , (270+$\theta 2n$, 270−$\theta 2n$) degrees, or totally 2n+1 types of Y pull magnetically-oriented magnetoresistive sensing units having magnetization orientation angles of 270, (270+$\theta 21$, 270−$\theta 21$), (270+$\theta 22$, 270−$\theta 22$), . . . , (270+$\theta 2n$, 270−$\theta 2n$) degrees,
wherein the values of $\theta 11$, $\theta 12$, . . . , $\theta 1n$, $\theta 21$, $\theta 22$, . . . , $\theta 2n$ are respectively between 0 and 90 degrees, and n is a positive integer greater than or equal to 1.

6. The magnetoresistive sensor wafer layout used for the laser writing system according to claim 5,
wherein any magnetoresistive orientation group comprises magnetically-oriented magnetoresistive sensing unit strings arranged in parallel,
wherein each magnetically-oriented magnetoresistive sensing unit string comprises a plurality of magnetoresistive sensing units, and
wherein the magnetically-oriented magnetoresistive sensing unit strings are in parallel with each other.

7. The magnetoresistive sensor wafer layout used for the laser writing system according to claim 6,
wherein the arrangement of the half-bridge structure of the single-axis X push-pull magnetoresistive sensor is comprised of:
the X push magnetically-oriented magnetoresistive sensing unit strings corresponding to the X push arm and the X pull magnetically-oriented magnetoresistive sensing unit strings corresponding to the X pull are separately arranged as X push arm/X pull arm in two rows and one column or two columns and one row, and the magnetically-oriented magnetoresistive sensing unit strings which are in parallel with the direction of the row or the column.

8. The magnetoresistive sensor wafer layout used for the laser writing system according to claim 6, wherein the arrangement of the full-bridge structure of the single-axis X push-pull magnetoresistive sensor is comprised of:

the X push magnetically-oriented magnetoresistive sensing unit strings corresponding to the X push arm and the X pull magnetically-oriented magnetoresistive sensing unit strings corresponding to the X pull arm separately arranged as X push arm/X push arm/X pull arm/X pull arm, X push arm/X pull arm/X push arm/X pull arm, X pull arm/X push arm/X push arm/X pull arm, or X push arm/X pull arm/X pull arm/X push arm in four rows and one column or four columns and one row, and the magnetically-oriented magnetoresistive sensing unit strings which are in parallel with the direction of the row or the column.

9. The magnetoresistive sensor wafer layout used for the laser writing system according to claim 6, wherein the arrangement of the half-bridge structure of the double-axis X-Y push-pull magnetoresistive sensor is comprised of:

the X push magnetically-oriented magnetoresistive sensing unit strings corresponding to the X push arm, the X pull magnetically-oriented magnetoresistive sensing unit strings corresponding to the X pull arm, the Y push magnetically-oriented magnetoresistive sensing unit strings corresponding to the Y push arm and the Y pull magnetically-oriented magnetoresistive sensing unit strings corresponding to the Y pull arm separately arranged as X push arm/Y push arm/Y pull arm/X pull arm, X push arm/Y pull arm/Y push arm/X pull arm, Y push arm/X push arm/X pull arm/Y pull arm, or Y push arm/X pull arm/X push arm/Y pull arm in four rows and one column or four columns and one row, and the magnetically-oriented magnetoresistive sensing unit strings which are in parallel with the direction of the row or the column.

10. The magnetoresistive sensor wafer layout used for the laser writing system according to claim 6, wherein the arrangement of the full-bridge structure of the double-axis X-Y push-pull magnetoresistive sensor is comprised of:

the X push magnetically-oriented magnetoresistive sensing unit strings corresponding to the X push arm, the X pull magnetically-oriented magnetoresistive sensing unit strings corresponding to the X pull arm, the Y push magnetically-oriented magnetoresistive sensing unit strings corresponding to the Y push arm and the Y pull magnetically-oriented magnetoresistive sensing unit strings corresponding to the Y pull arm separately arranged as X half bridge/Y full bridge/X half bridge, Y half bridge/X full bridge/Y half bridge, X double push arms/Y full bridge/X double pull arm bridge, or Y double push arms/X full bridge/Y double pull arms in eight rows and one column or eight columns and one row, wherein the X half bridge is X push arm/X pull arm, the Y half bridge is Y push arm/Y pull arm, the X full bridge is X push arm/X push arm/X pull arm/X pull arm, X push arm/X pull arm/X push arm/X pull arm, X pull arm/X push arm/X push arm/X pull arm, or X push arm/X pull arm/X pull arm/X push arm, the Y full bridge is Y push arm/Y push arm/Y pull arm/Y pull arm, Y push arm/Y pull arm/Y push arm/Y pull arm, Y pull arm/Y push arm/Y push arm/Y pull arm, or Y push arm/Y pull arm/Y pull arm/Y push arm, the X double push arms are X push arm/X push arm, the X double pull arms are X pull arm/X pull arm, the Y double push arms are Y push arm/Y push arm, and the magnetically-oriented magnetoresistive sensing unit strings which are in parallel with the direction of the row or the column.

11. The magnetoresistive sensor wafer layout used for the laser writing system according to claim 10, wherein, in the arrangement structure of the X push arm/X push arm, the X pull arm/X pull arm, the Y push arm/Y push arm and the Y pull arm/Y pull arm, the magnetoresistive orientation groups formed by the X push magnetically-oriented magnetoresistive sensing unit strings corresponding to two X push arms and having the same magnetic orientation angle are combined into a new magnetoresistive orientation group;

wherein the magnetoresistive orientation groups formed by the X pull magnetically-oriented magnetoresistive sensing unit strings corresponding to two X pull arms and having the same magnetic orientation angle are combined into a new magnetoresistive orientation group;

wherein the magnetoresistive orientation groups formed by the Y push magnetically-oriented magnetoresistive sensing unit strings corresponding to two Y push arms and having the same magnetic orientation angle are combined into a new magnetoresistive orientation group; and wherein the magnetoresistive orientation groups formed by the Y pull magnetically-oriented magnetoresistive sensing unit strings corresponding to two Y pull arms and having the same magnetic orientation angle are combined into a new magnetoresistive orientation group.

12. The magnetoresistive sensor wafer layout used for the laser writing system according to claim 6, wherein the arrangement of the full-bridge structure of the single-axis X push-pull magnetoresistive sensor is comprised of:

the two X push arms and the two X pull arms arranged as an array of two rows and two columns, wherein the two X push arms and the two X pull arms are respectively located in the same row or the same column, and wherein the X pull magnetoresistive orientation groups having the same magnetic orientation angle and corresponding to the two X push arms or the X pull magnetoresistive orientation groups having the same magnetic orientation angle and corresponding to the two X pull arms form a new magnetoresistive orientation group along the direction of the same row or the same column.

13. The magnetoresistive sensor wafer layout used for the laser writing system according to claim 6, wherein the arrangement of the full bridge structure of the double-axis X-Y push-pull magnetoresistive sensor is comprised of:

the two X push arms, two X pull arms, two Y push arms and two Y pull arms are arranged in an array of four rows and two columns,
 wherein the second row and the third row respectively correspond to the X push arms and the X pull arms, and the first row and the fourth row respectively correspond to the Y push arms and the Y pull arms; or
 wherein the second row and the third row respectively correspond to the Y push arms and the Y pull arms, and the first row and the fourth row respectively correspond to the X push arms and the X pull arms,
 wherein the X push magnetoresistive orientation groups having the same magnetic orientation angle and corresponding to the two X push arms in the same row or the same column form a new magnetoresistive orientation group along the direction of the same row or the same column, or the X pull magnetoresistive orientation groups having the same magnetic orientation angle and corresponding to the two X pull arms form a new magnetoresistive orientation group along the direction of the same row or the same column.

14. The magnetoresistive sensor wafer layout used for the laser writing system according to claim 6,
 wherein the X push arm and X pull arm of the single-axis X push-pull magnetoresistive sensor respectively comprise at least two non-adjacent X push orientation subunits and X pull orientation subunits; and
 wherein each orientation subunit comprises one or more magnetoresistive orientation groups, all the orientation subunits are arranged in a mixed manner, and two adjacent orientation subunits are different.

15. The magnetoresistive sensor wafer layout used for the laser writing system according to claim 6,
 wherein the X push arm, X pull arm, Y push arm and Y pull arm of the double-axis X-Y push-pull magnetoresistive sensor respectively comprise at least two non-adjacent X push orientation subunits, X pull orientation subunits, Y push orientation subunits and Y pull orientation subunits,
 wherein each orientation subunit comprises one or more magnetoresistive orientation groups, all the orientation subunits are arranged in a mixed manner, and two adjacent orientation subunits are different.

16. A laser scanning method for the magnetoresistive sensor wafer layout according to claim 1,
 wherein the method comprises the following steps:
 S1: a laser spot scanning one or more magnetoresistive orientation groups or orientation subunits according to a scanning sequence;
 S2: heating the antiferromagnetic layers of the magnetoresistive sensing units to above the blocking temperature through the laser spot in the scanning process;
 S3: cooling the antiferromagnetic layers, and applying an external magnetic field along the direction of the magnetization orientation angle of the antiferromagnetic layers in the process of cooling to room temperature; and
 S4: removing the external magnetic field to realize the writing operation to the magnetoresistive sensing units with the magnetization orientation angle.

17. The laser scanning method according to claim 16,
 wherein the scanning sequence in which the laser spot scans multiple magnetoresistive orientation groups or orientation subunits in step S1 is as follows:
 S11: the laser spot sequentially scanning the magnetoresistive orientation groups or orientation subunits having the same magnetization orientation angle in each of the adjacent dice along the direction of the magnetoresistive sensing unit string;
 S12: changing to another row, and scanning a next magnetoresistive orientation group or orientation subunit having the same magnetization orientation angle until the scanning of the magnetoresistive orientation groups or orientation subunits having the same magnetization orientation angle is completed; and
 S13: after completing step S12, scanning a next magnetoresistive orientation group or orientation subunit having a different magnetization orientation angle.

18. The laser scanning method according to claim 17,
 wherein the scanning sequence in which the laser spot scans one magnetoresistive orientation group or orientation subunit in the step is as follows:
 S11: the laser spot sequentially scanning the magnetically-oriented magnetoresistive sensing unit strings in a single magnetoresistive orientation group or orientation subunit along the direction of the magnetoresistive sensing unit string; and
 S12: changing to another row, and scanning the magnetically-oriented magnetoresistive sensing unit strings in a next single magnetoresistive orientation group or orientation subunit along an opposite direction until the scanning of all magnetically-oriented magnetoresistive sensing unit strings in the single magnetoresistive orientation group or orientation subunit is completed.

19. The laser scanning method according to claim 16,
 wherein the scanning sequence in which the laser spot scans multiple magnetoresistive orientation groups or orientation subunits in step S1 is as follows:
 S11: the laser spot sequentially scanning the adjacent magnetoresistive orientation groups or orientation subunits having the same magnetization orientation angle in each of the dice along the direction of the magnetoresistive sensing unit string;
 S12: changing to another row, and scanning a next adjacent magnetoresistive orientation group or orientation subunit having the same magnetization orientation angle until the scanning of all magnetoresistive orientation groups or orientation subunits having the same magnetization orientation angle is completed; and
 S13: after completing step S12, scanning a next magnetoresistive orientation group or orientation subunit having a different magnetization orientation angle.

* * * * *

UNITED STATES PATENT AND TRADEMARK OFFICE
CERTIFICATE OF CORRECTION

PATENT NO. : 10,663,536 B2
APPLICATION NO. : 16/333121
DATED : May 26, 2020
INVENTOR(S) : Deak et al.

Page 1 of 1

It is certified that error appears in the above-identified patent and that said Letters Patent is hereby corrected as shown below:

In the Claims

In Column 19, Line 3, in Claim 7, delete "are" and insert --arm-- therefor

In Column 21, Line 2, in Claim 13, after "arms", delete "arc"

Signed and Sealed this
Fifteenth Day of December, 2020

Andrei Iancu
*Director of the United States Patent and Trademark Office*